(12) United States Patent
Fujino et al.

(10) Patent No.: US 7,659,777 B2
(45) Date of Patent: Feb. 9, 2010

(54) OFFSET ADJUSTMENT DEVICE, SEMICONDUCTOR DEVICE, DISPLAY DEVICE, OFFSET ADJUSTMENT METHOD, NOISE DETECTION DEVICE, AND NOISE DETECTION METHOD

(75) Inventors: Hiroaki Fujino, Kizugawa (JP); Tetsuya Minamiguchi, Yamatokoriyama (JP); Michihiro Nakahara, Yamatokoriyama (JP); Takahiro Nakai, Tenri (JP); Tomoaki Nakao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 6 days.

(21) Appl. No.: 11/882,724

(22) Filed: Aug. 3, 2007

(65) Prior Publication Data

US 2008/0246544 A1    Oct. 9, 2008

(30) Foreign Application Priority Data

Aug. 4, 2006   (JP)   .............................. 2006-213886

(51) Int. Cl.
*H03F 1/02* (2006.01)
(52) U.S. Cl. ........................................................ 330/9
(58) Field of Classification Search .................... 330/9, 330/51, 124 R, 295; 327/124, 307
See application file for complete search history.

(56) References Cited

U.S. PATENT DOCUMENTS

| | | | |
|---|---|---|---|
| 5,397,944 A | | 3/1995 | DePuis |
| 6,762,643 B2 * | | 7/2004 | Milanesi .......................... 330/9 |
| 7,459,966 B2 * | | 12/2008 | Nakao ............................. 330/9 |

| | | | |
|---|---|---|---|
| 2003/0103029 A1 | | 6/2003 | Kokubun et al. |
| 2003/0164730 A1 | | 9/2003 | Milanesi |
| 2005/0270264 A1 | | 12/2005 | Kokubun et al. |
| 2006/0255855 A1 | | 11/2006 | Nakao |

FOREIGN PATENT DOCUMENTS

| | | |
|---|---|---|
| JP | 62-247611 | 10/1987 |
| JP | 04-274605 | 9/1992 |
| JP | 4-274605 | 9/1992 |
| JP | 06-232706 | 8/1994 |
| JP | 6-314490 | 11/1994 |
| JP | 09-229823 | 9/1997 |
| JP | 2003-044019 | 2/2003 |
| JP | 2003-168936 | 6/2003 |
| JP | 2004-519969 | 7/2004 |
| KR | 10-2006-0081037 | 7/2006 |

* cited by examiner

*Primary Examiner*—Robert Pascal
*Assistant Examiner*—Khiem D Nguyen
(74) *Attorney, Agent, or Firm*—Harness Dickey & Pierce, P.L.C.

(57) ABSTRACT

In one embodiment of the present invention, an operational amplifier circuit, a switching element is closed and a switching element is opened. A latch circuit DL latches an output voltage of an operational amplifier and supplies a Q output corresponding to the output voltage. A control circuit supplies an offset adjustment signal to an offset adjustment input terminal OR of the operational amplifier, thereby adjusting an offset of the output voltage. The latch circuit DL latches again the output voltage thus adjusted and minutely adjusts the offset adjustment signal so as to adjust the remaining offset. Weighting is carried out in accordance with how many times latching has been carried out, and the offset of the output voltage of the operational amplifier is quantized, thereby obtaining a binary logical signal and storing the signal in the control circuit.

12 Claims, 18 Drawing Sheets

US 7,659,777 B2

OFFSET ADJUSTMENT DEVICE, SEMICONDUCTOR DEVICE, DISPLAY DEVICE, OFFSET ADJUSTMENT METHOD, NOISE DETECTION DEVICE, AND NOISE DETECTION METHOD

This non-provisional application claims priority under 35 U.S.C. § 119(a) on Patent Application No. 2006-213886 filed in Japan on Aug. 4, 2006, the entire contents of which are hereby incorporated by reference.

FIELD OF THE INVENTION

The present invention relates to an offset adjustment for an operational amplifier circuit. Particularly, the present invention is for reducing a variation in a random offset of an output operational amplifier circuit in a TFT-LCD source driver circuit, which offset is caused by a production-caused variation.

BACKGROUND OF THE INVENTION

In general, a TFT-LCD drive circuit drives a liquid crystal panel by (i) digitally processing a display signal, and (ii) converting, with a use of a DA converter, the digitally processed display signal into an analog voltage according to a display tone of the display signal. In recent years, a load of the liquid crystal panel has been increasingly becoming large for a drive circuit, with an increase in the size of the liquid crystal panel. On this account, in general, a low-output-impedance output circuit is formed as a voltage follower circuit by using an operational amplifier, and an output signal from the DA converter is input to this low-output-impedance output circuit. Thus, the output signal from the DA converter is converted into an output signal from the low-output-impedance output circuit, and this output signal from the output circuit is used for driving a liquid crystal panel.

FIG. 19 illustrates an exemplary configuration of a TFT-LCD module. In the TFT-LCD module, a liquid crystal panel 101 is driven by a plurality of gate driver circuits 103 and a plurality of source driver circuits 104, each of which is controlled by a control circuit 102.

FIG. 20 illustrates a configuration of each of the source driver circuits 104. Each source driver circuit 104 includes, sequentially from a side of the control circuit 102 towards a side of the liquid crystal panel 101: shift registers 104a; sampling latch circuits 104b; hold latch circuits 104c; level shifter circuits 104d; DA converters 104e; and output amplifiers 104f.

Further, FIG. 21 illustrates an exemplary configuration of the TFT-LCD source driver circuit 104 for each output terminal. In the following explanation with reference to FIG. 21, it is assumed that display data is in 6 bits. For each bit of the 6-bit display data, one of the sampling latch circuits 104b, one of the hold latch circuits 104c, and one of the level shifter circuits 104d are provided.

Each bit of the display data is sampled in the sampling latch circuit 104b in response to an input of a start pulse signal (not shown) forwarded via the shift register 104a. Then, in the hold latch circuit 104c, each of the 6 bits is latched in response to a latch signal (horizontal synchronization signal) (not shown). After a signal level of the display data is converted in the level shifter circuit 104d, a voltage for tone display is selected in the DA converter 104e, in accordance with the display data (6 bits in this case). Then, the selected voltage for tone display is output to the liquid crystal panel 101, from the output amplifier 104f which is configured by a voltage follower circuit.

In FIG. 21, the shift register 104a, the sampling latch circuit 104b, and the hold latch circuit 104c are conventionally logical circuits. Further, the DA converter 104e and the output amplifier 104f are analog circuits. As described above, the output amplifier 104f is usually a voltage follower circuit which is configured by an operational amplifier. The level shifter circuit 104d is provided between the logical circuit and the analog circuit. This level shifter circuit 104d converts a voltage level of a logical signal into a voltage level for displaying images on the liquid crystal panel 101. An LSI of the TFT-LCD source driver circuits 104 (hereinafter referred to as a source driver LSI) includes therein a plurality of the circuits illustrated in FIG. 21, and an output voltage of each of the circuits drives each display data line of the liquid crystal panel 101.

Ideally, a voltage output from the voltage follower circuit (i.e. output amplifier 104f) which is configured by the operational amplifier is equal to a voltage input to the voltage follower circuit. However, in an actual LSI, due to a production variation, there is a random variation in the voltages respectively output from the operation amplifiers in the LSI. This random variation is called "offset variation". If this offset variation occurs in the source driver LSI, drive voltages to be respectively applied to the display data lines of the liquid crystal panel 101 vary on a line-by-line basis. The display brightness of the liquid crystal panel 101 is controlled by the drive voltage applied to the display data line. Thus, the line-by-line variation in the drive voltages applied to the data lines causes a non-uniform display. Accordingly, in the source driver LSI, the variation in the output voltages respectively from the plurality of the liquid crystal driving voltage output terminals needs to be restrained to a level at which the display quality is not affected.

This offset variation of the operational amplifier in the source driver LSI is mainly attributed to a difference (mismatching) in finish properties of paired elements whose properties are supposed to be identical. In general, such an offset variation has been reduced as follows. Namely, the size of a circuit element constituting an operational amplifier is enlarged, and an extra caution is taken for arrangement of the circuit element in a layout designing process using a mask. Further, an offset adjustment circuit is added for adjusting an offset in an amplifier. For the offset adjustment circuit, various conventional methods are suggested.

FIG. 16 illustrates a first example of a conventional offset adjustment circuit (see Patent Document 1 (published Japanese translation of PCT international publication for patent application: Tokuhyo 2004-519969 (published on Jul. 2, 2004)). FIG. 16 illustrates: a common phase input terminal IN101; a negative-phase input terminal IN102; an output terminal OUT101; and a capacitor C101 for storing and retaining therein an offset adjustment voltage. Further, the offset adjustment circuit of FIG. 16 includes two switching elements S101 and a single switching element S102. Note that, in the present specification, including the description regarding this example, an input terminal of an operational amplifier is referred to as non-inverting input terminal and inverting input terminal, and is distinguished from: a common phase input terminal for inputting a signal to the non-inverting input terminal; and a negative-phase input terminal for inputting a signal to the inverting input terminal, unless otherwise notified.

The capacitor C101 is provided between (i) the inverting input terminal of the operational amplifier 111 and (ii) the negative-phase input terminal IN102. Further, one of the switching elements S101 is provided between the common phase input terminal IN101 and a point between the capacitor C101 and the negative-phase input terminal IN102. Another one of the switching elements S101 is provided between the output terminal of the operational amplifier 111 and the inverting input terminal of the operational amplifier 111. The switch S102 is provided between the negative-phase input terminal IN102 and the capacitor C101. Further, the offset voltage of the operational amplifier 111 is a voltage source Voff located between the non-inverting input terminal of the operational amplifier 111 and the common phase input terminal IN101.

This circuit adjusts an offset by alternating between (i) a storing state during which an offset adjustment voltage is stored, and (ii) a normal state during which the circuit serves as an ordinal operational amplifier. The switches S101 are closed, and the switch S102 is opened. Thus, the circuit enters the storing state. At this point, both ends of the capacitor C101 are charged by the electric potential of the offset voltage Voff. Then, the switches S101 are opened and the switch S102 is closed. Thus, the circuit enters the normal state. At this point, a difference between the electrical potentials at the both ends of the capacitor C101 equals to the Voff. Therefore, the offset voltage is cancelled.

FIGS. 17 and 18 illustrate second examples of conventional offset adjustment circuits. FIG. 17 illustrates an exemplary configuration of a CMOS operational amplifier circuit to which an offset adjustment circuit is added. FIG. 18 illustrates an application example where the circuit of FIG. 17 is applied to a voltage follower circuit.

The operational amplifier circuit of FIG. 17 includes: adjustment input terminals AUX1 and AUX2 for use in offset adjustment; a common phase input terminal IN111 (corresponding to a non-inverting input terminal); and a negative-phase input terminal IN112 (corresponding to an inverting input terminal). This operational amplifier circuit further includes: a first difference input pair including NMOS transistors T102 and T103; and a second difference input pair including NMOS transistors T105 and T106. The first difference input pair takes, as a bias current, a drain current of an NMOS transistor T101, and the second difference input pair takes, as a bias current, a drain current of an NMOS transistor T104. Further, the first and second difference input pairs share a common active load which is a current mirror circuit including PMOS transistors T107 and T108. The first difference input pair serves as an input section of the offset adjustment circuit. The gate terminal of the NMOS transistor T102 is connected to the common phase input terminal IN111, and the gate terminal of the NMOS transistor T103 is connected to the negative-phase input terminal IN112. The second difference input pair serves as an input section for an offset adjustment voltage. The gate terminal of the NMOS transistor T105 is connected to the adjustment input terminal AUX1, and the gate terminal of the NMOS transistor T106 is connected to the adjustment input terminal AUX2.

Further, the offset adjustment circuit includes an output transistor which is the PMOS transistor T110. This output transistor takes, as a bias current, a drain current of the NMOS transistor T109. The gate terminal of the PMOS transistor T110 is connected to (i) the drain terminal of the NMOS transistor T102 of the first difference input pair and (ii) the drain terminal of the NMOS transistor T105 of the second difference input pair. A voltage to be applied to the gate terminal of the PMOS transistor T110 is determined based on (i) a drain current flowing in the first difference input pair, and (ii) a drain current flowing in the second difference input pair. Based on this voltage, a current to be output from the drain terminal of the PMOS transistor T110 is determined, the drain terminal being connected to the output terminal OUT111 which serves as an output terminal of the offset adjustment circuit.

In the application example illustrated in FIG. 18, the offset adjustment circuit of FIG. 17 is used as an operational amplifier 121. Further, three switching elements S121, a single switching element S122, and capacitors C111 and C112 are provided around the operational amplifier 121. A non-inverting input terminal of the operational amplifier 121 corresponds to the common phase input terminal IN111 of FIG. 17, and an inverting input terminal of the operational amplifier 121 corresponds to the negative-phase input terminal IN112 of FIG. 17. The offset voltage of the operational amplifier 121 is a voltage source Voff provided between (i) a non-inverting input terminal of the operational amplifier 121 and (ii) an input terminal IN121 of the voltage follower circuit.

Here, the point-A is a node via which the input terminal IN121 and the voltage source Voff are connected with each other, and the point-B is the inverting input terminal of the operational amplifier 121. One of the switching elements 121 is provided between the point-A and the point-B. Further, the switching element 122 is provided between the point-B and the output terminal of the operational amplifier 121.

The capacitor C111 is provided between an adjustment input terminal AUX1 and a GND, and the capacitor C112 is provided between the adjustment input terminal AUX2 and the GND. Another one of the switching elements S121 is provided between the point-A and the adjustment input terminal AUX1, and further another one of the switching elements S121 is provided between an output terminal OUT121 of the voltage follower circuit and the adjustment input terminal AUX2.

Next, the following describes an operation of the voltage follower circuit illustrated in FIG. 18.

This circuit adjusts an offset by alternating between (i) a storing state during which an offset adjustment voltage is stored and (ii) a normal state during which the circuit serves as an ordinal operational amplifier. The switching elements S121 are closed and the switching element S122 is opened. Thus, the circuit enters the storing state. At this time, the point-A and the point-B are short-circuited, and have the same electric potential. An input voltage is applied to the adjustment input terminal AUX1, and is stored in the capacitor C111. Further, an output voltage of the operational amplifier 121 is fed back to the adjustment input terminal AUX2. The operational amplifier 121 is a circuit whose difference input terminal is the adjustment input terminals AUX1 and AUX2, and serves as a voltage follower. The output voltage of this operational amplifier 121 is stored in the capacitor C112. The voltage stored at this time in the capacitor C112 is a voltage for balancing the operational amplifier 121 while the voltages at the point-A and the point-B are the same.

Next, the switching elements S121 are opened, and the switching element S122 is closed. Thus, the operational amplifier enters the normal state. The point-B and the output terminal of the operational amplifier 121 (i.e. the output terminal OUT121) are short-circuited via the switching element S122. The capacitor C111 and C112 store and maintain such an electric potential that voltages at the point-A and the point-B are equal to each other. As a result, the same voltage as the voltage at the point-A is output to the output terminal OUT 121 which has been short-circuited to the point-B. Thus, an output from the voltage follower has no offset voltage.

Other than the above described techniques, various methods and/or configurations for offset adjustment are disclosed in: Patent Document 1, Patent Document 2 (Japanese Unexamined Patent Publication No. 274605/1992 (Tokukaihei 4-274605; published on Sep. 30, 1992), and Patent Document 3 (Japanese Unexamined Patent Publication No. 314490/1994 (Tokukaihei 6-314490; published on Nov. 8, 1994). All the methods and configurations disclosed in these documents adjust an offset by storing, in a capacitor, an offset adjustment voltage of an operational amplifier. Despite the variety in the circuit configurations, any of these methods are based on the following principle. Namely, while a common phase input terminal and a negative-phase input terminal are short-circuited, (i) a negative feedback process is carried out with respect to an offset adjusting terminal so that an output voltage of an operational amplifier is balanced at a medium electric potential between positive and negative power source voltages, and (ii) the voltage is stored in a capacitor. In these methods, an offset is adjusted by periodically alternating a state of an offset adjustment circuit, between (i) a storing state during which an offset adjustment voltage is stored and (ii) a normal state during which the offset adjustment circuit serves as an ordinal operational amplifier.

Conventionally, an offset variation among drive terminals in a source driver LSI has been reduced by: (i) increasing the size of a configuring element which influences a random variation, so that a matting is improved; and/or (ii) designing a circuit in consideration of a symmetrical property of a mask layout for an LSI. These methods, however, lead to an increase in the size of a chip and in production costs, when an offset adjustment circuit is formed into an LSI.

Another method for reducing the offset variation is to provide an offset adjustment circuit in a source driver LSI. A conventional offset adjustment circuit adjusts an offset by storing in a capacitor an offset adjustment voltage of an operational amplifier. Such an offset adjustment circuit includes a capacitor for offset adjustment, and a switching element. In an LSI having a typical CMOS configuration, the switching element is an MOS-FET. In the MOS-FET switch, a phenomenon so-called gate feed through occurs. This gate feed through is a phenomenon in which a charge is injected through a parasitic capacitance or the like, which capacitance is caused by a change in an electrical potential of a gate signal. Due to the charge injection, an amount of charge stored in an offset adjustment capacitor deviates from an expected amount. For the purpose of reducing such an influence, it has been suggested that a capacitor be enlarged, and that an offset adjustment voltage be sampled by using a differential circuit, as in the second example of the offset conventional adjustment circuit. However, in either case, an increase in a circuit scale is inevitable. This leads to an increase in a chip size and to an increase in production costs, when an offset adjustment circuit is formed into an LSI.

Further, a voltage to be stored in a capacitor is an analog voltage according to an offset voltage of an operational amplifier. This voltage to be stored in a capacitor varies with elapse of time due to a leak current or the like. It is therefore necessary to periodically refresh the voltage stored in the capacitor. On this account, in the configuration using a capacitor, an offset is adjusted by repetitively alternating the state of the offset adjustment circuit between (i) a storing state during which an offset adjustment voltage is stored and (ii) a normal state during which the offset adjustment circuit functions as an ordinal operational amplifier. During the offset adjustment voltage storing state, the offset adjustment circuit is not able to function as an ordinal amplifier. As such, period during which an output signal cannot be used periodically occurs.

A period for applying a display voltage to each pixel has been shortened in a recent enlarged liquid crystal panel whose number of display pixels has been increased. Therefore, it is necessary to apply a voltage at a high speed. For this reason, a liquid crystal drive circuit is preferably capable of carrying out a continuous voltage output. This makes it extremely difficult to adopt the conventional offset adjustment circuit. In order to solve this problem, it is suggested that two pairs of circuits be prepared, and that the two pairs of circuits alternately carry out an output drive and offset adjustment, thereby realizing the continuous driving. However, this method doubles a circuit scale. Therefore, an increase in costs is inevitable.

SUMMARY OF THE INVENTION

The present invention was made in view of the foregoing problems. An object of the present invention is to provide: an offset adjustment device which is capable of adjusting an offset by absorbing offset variation with a small-scale circuit, and which does not require a frequent refreshing process; a semiconductor device including the offset adjustment device; a display device including the offset adjustment device; an offset adjustment method; a noise detection device; and a noise detection method.

In order to achieve the foregoing object, the offset adjustment device of the present invention is an offset adjustment device, including an operational amplifier that includes at least a non-inverting input terminal and an inverting input terminal, the offset adjustment device causing a storage section to store a binary logical signal indicative of an output voltage of the operational amplifier at a time when an output of the operational amplifier is not fed back to the non-inverting input terminal and the inverting input terminal and when the non-inverting input terminal and the inverting input terminal are short-circuited with each other, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value, the offset adjustment device adjusting an offset of the output voltage of the operational amplifier with respect to the reference value by using the logical signal stored in the storage section.

With the invention, when an output of the operational amplifier is not fed back to the non-inverting input terminal and the inverting input terminal, the non-inverting input terminal and the inverting input terminal are short-circuited with each other so that an input voltage is 0. Consequently, it is possible to obtain an offset that is a deviation of the output voltage of the operational amplifier with respect to the reference value. Further, it is possible to regard a state in which a positive or negative offset is generated as a state in which an output voltage is saturated.

The storage section stores the binary logical signal indicative of the offset of the output voltage of the operational amplifier, the binary logical signal having (i) a first logical value in a case where the output voltage is positive with respect to the reference value, and (ii) a second logical value in a case where the output voltage is negative with respect to the reference value, and the offset of the output voltage is adjusted using the stored logical signal. Consequently, a large capacity or a frequent refreshment process is not required unlike a case where an analog voltage is stored. Further, since a case-by-case offset adjustment can be performed, a random variation in the offset is reduced. This is advantageous because designing of a remarkably large-sized element is not necessary and no particular consideration is needed in designing mask layout of an LSI. Consequently, it is possible to reduce a chip size and a cost.

Thus, it is possible to realize a small-scale offset adjustment device which is capable of adjusting an offset while absorbing an offset variation, and which does not require a frequent refreshing process.

In order to achieve the foregoing object, the offset adjustment device of the present invention is an offset adjustment device, including an operational amplifier that includes at least a non-inverting input terminal and an inverting input terminal, the offset adjustment device further including: a first switching element for short-circuiting the non-inverting input terminal and the inverting input terminal; a second switching element for disconnecting one of the non-inverting input terminal and the inverting input terminal from a signal input terminal that, in a normal state of the operational amplifier, corresponds to the non-inverting input terminal and the inverting input terminal; a latch section that includes one or more latch circuits each for latching a binary logical signal indicative of an output voltage of the operational amplifier and for outputting the logical signal as a first latch signal, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value; a storage section for serially latching and storing the first latch signal that is input thereto multiple times in a chronological order from the latch section and for outputting a second latch signal with multiple bits in response to the first latch signal while serially latching the first latch signal; and a control circuit for (i) generating, in accordance with the second latch signal output from the storage section, an offset adjustment signal for adjusting an offset of the output voltage of the operational amplifier with respect to the reference value, and (ii) supplying the generated offset adjustment signal to the operational amplifier.

With the invention, when the first switching element short-circuits the non-inverting input terminal and the inverting input terminal of the operational amplifier, and when the second switching element disconnects one of the non-inverting input terminal and the inverting input terminal from the corresponding signal input terminal used in the normal state of the operational amplifier, the operational amplifier functions as a comparator and an input voltage to the operational amplifier becomes 0. Consequently, it is possible to obtain an offset that is a deviation of the output voltage of the operational amplifier with respect to the reference value. Further, it is possible to regard a state in which a positive or negative offset is generated as a state in which an output voltage is saturated.

The latch circuit of the latch section latches a binary logical signal indicative of an offset of an output voltage of the operational amplifier, the logical signal having (i) a first logical value in a case where the output voltage is positive with respect to the reference value, and (ii) a second logical value in a case where the output voltage is negative with respect to the reference value, and the latch circuit outputs the logical signal as a first latch signal. The storage section serially latches and stores the first latch signal that is input thereto multiple times in a chronological order from the latch section, and the storage section outputs a second latch signal with multiple bits in response to the first latch signal while serially latching the first latch signal. Consequently, the control circuit generates an offset adjustment signal in line with the second latch signal output from the storage section, and inputs the offset adjustment signal to the operational amplifier, and an offset as a result of this input is input again as a second latch signal to the control circuit. This operation is repeated, and offset adjustment is completed.

As described above, the offset of the output voltage of the operational amplifier is stored as a binary logical signal and the stored logical signal is used to adjust the offset of the output voltage. Consequently, a large capacity or a frequent refreshment process is not required unlike a case where an analog voltage is stored. Further, since a case-by-case offset adjustment can be performed, a random variation in the offset is reduced. This is advantageous because designing of a remarkably large-sized element is not necessary and no particular consideration is needed in designing mask layout of an LSI. Consequently, it is possible to reduce a chip size and a cost.

Thus, it is possible to realize a small-scale offset adjustment device which is capable of adjusting an offset while absorbing an offset variation, and which does not require a frequent refreshing process.

In order to achieve the foregoing object, the offset adjustment device of the present invention is an offset adjustment device, including an operational amplifier that includes at least a non-inverting input terminal and an inverting input terminal, the offset adjustment device including: a first switching element for short-circuiting the non-inverting input terminal and the inverting input terminal; a second switching element for disconnecting one of the non-inverting input terminal and the inverting input terminal from a signal input terminal that, in a normal state of the operational amplifier, corresponds to the non-inverting input terminal and the inverting input terminal; a storage section that includes a plurality of latch circuits each for latching a binary logical signal indicative of an output voltage of the operational amplifier and for outputting the logical signal as a first latch signal, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value, each of the latch circuits carrying out a latch operation with timing that is settable independently, the first latch signal being a predetermined logical value before the latch operation, and the storage section outputting a second latch signal with multiple bits in response to the first latch signal from each of the latch circuits; and a control circuit for (i) generating, in accordance with the second latch signal output from the storage section, an offset adjustment signal for adjusting an offset of the output voltage of the operational amplifier with respect to the reference value, and (ii) supplying the generated offset adjustment signal to the operational amplifier.

With the invention, when the first switching element short-circuits the non-inverting input terminal and the inverting input terminal of the operational amplifier, and when the second switching element disconnects one of the non-inverting input terminal and the inverting input terminal from the corresponding signal input terminal used in the normal state of the operational amplifier, the operational amplifier functions as a comparator and an input voltage to the operational amplifier becomes 0. Consequently, it is possible to obtain an offset that is a deviation of the output voltage of the operational amplifier with respect to the reference value. Further, it is possible to regard a state in which a positive or negative offset is generated as a state in which an output voltage is saturated.

Each of the latch circuits of the latch section latches a binary logical signal indicative of an offset of an output voltage of the operational amplifier, the logical signal having (i) a first logical value in a case where the output voltage is positive with respect to the reference value, and (ii) a second logical value in a case where the output voltage is negative with respect to the reference value, and each of the latch circuits outputs the logical signal as a first latch signal. The number of the latch circuits is plural. Each latch circuit carries out a latch operation with timing that is settable independently. An output of each latch circuit before the latch operation is set to a predetermined logical value, which is regarded as the first latch signal. Consequently, each of the latch circuits always outputs the first latch signal, and the storage section outputs the second latch signal with multiple bits in response to the first latch signal from each of the latch circuits.

The control circuit generates an offset adjustment signal in accordance with a second latch signal from the storage section. Because each of the latch circuits carries out a latch operation with timing that is settable independently, offset adjustment is carried out in accordance with a second latch signal which is in response to a first latch signal of the latch circuit that has carried out the latch operation with the earliest timing. An offset as a result of the offset adjustment is supplied, to the control circuit, as a second latch signal which is in response to a first latch signal of the latch circuit that latches the offset. This operation is repeated and offset adjustment is completed.

As described above, the offset of the output voltage of the operational amplifier is stored as a binary logical signal and the stored logical signal is used to adjust the offset of the output voltage. Consequently, a large capacity or a frequent refreshment process is not required unlike a case where an analog voltage is stored. Further, since a case-by-case offset adjustment can be performed, a random variation in the offset is reduced. This is advantageous because designing of a remarkably large-sized element is not necessary and no particular consideration is needed in designing mask layout of an LSI. Consequently, it is possible to reduce a chip size and a cost.

Thus, it is possible to realize a small-scale offset adjustment device which is capable of adjusting an offset while absorbing an offset variation, and which does not require a frequent refreshing process.

In order to achieve the foregoing object, the semiconductor device of the present invention includes the offset adjustment device.

With the invention, it is possible to realize a small-scale semiconductor device which is capable of adjusting an offset while absorbing an offset variation, and which does not require a frequent refreshing process.

In order to achieve the foregoing object, the display device of the present invention includes the semiconductor device as a display driving device.

With the invention, it is possible to realize a display device with high-quality that uses a small-scale driving device which is capable of carrying out highly reliable offset adjustment.

In order to achieve the foregoing object, the semiconductor device of the present invention is a semiconductor device, including a plurality of operational amplifiers each for supplying an output voltage to a display panel, the semiconductor device further including: an offset generation section for short-circuiting the non-inverting input terminal and the inverting input terminal without an output of each of the operational amplifiers being fed back to the non-inverting input terminal and the inverting input terminal, so as to generate an offset of the output voltage of each of the operational amplifiers with respect to a reference value that is an ideal output voltage of each of the operational amplifiers when a differential input is 0; a storage section for storing a multiple-bit binary logical signal indicative of the offset generated by the offset generation section, the logical signal having (i) a first logical value in a case where the output voltage is positive with respect to the reference value, and (ii) a second logical value in a case where the output voltage is negative with respect to the reference value; and an offset generation control section for supplying, to the offset generation section, a trigger signal indicative of generation of the offset, when a power of the display panel is supplied, when the semiconductor device operates, or when other semiconductor device having a function identical with that of the semiconductor device operates.

With the invention, it is possible to realize a small-scale semiconductor device which is capable of adjusting an offset while absorbing an offset variation, and which does not require a frequent refreshing process.

In order to achieve the foregoing object, the display device of the present invention is a display device, including a semiconductor device that includes a plurality of operational amplifiers each for supplying an output voltage to a display panel, the semiconductor device further including: an offset generation section for short-circuiting the non-inverting input terminal and the inverting input terminal without an output of each of the operational amplifiers being fed back to the non-inverting input terminal and the inverting input terminal, so as to generate an offset of the output voltage of each of the operational amplifiers with respect to a reference value that is an ideal output voltage of each of the operational amplifiers when a differential input is 0; a storage section for storing a multiple-bit binary logical signal indicative of the offset generated by the offset generation section, the binary logical signal having (i) a first logical value in a case where the output voltage is positive with respect to the reference value, and (ii) a second logical value in a case where the output voltage is negative with respect to the reference value; and an offset generation control section for supplying, to the offset generation section, a trigger signal indicative of generation of the offset, when a power of the display panel is supplied, when the semiconductor device operates, or when other semiconductor device having a function identical with that of the semiconductor device operates.

With the invention, it is possible to realize a display device with high-quality that uses a small-scale driving device which is capable of carrying out highly reliable offset adjustment.

In order to achieve the foregoing object, the offset adjustment method of the present invention is an offset adjustment method, including the steps of: storing a binary logical signal indicative of an output voltage of an operational amplifier including at least a non-inverting input terminal and an inverting input terminal, the output voltage being a voltage at a time when an output of the operational amplifier is not fed back to the non-inverting input terminal and the inverting input terminal and when the non-inverting input terminal and the inverting input terminal are short-circuited with each other, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value; and adjusting an offset of the output voltage of the operational amplifier with respect to the reference value by using the logical signal stored in the storage section.

With the invention, it is possible to realize an offset adjustment method which allows a small-scale circuit to adjust an offset while absorbing an offset variation, and which does not require a frequent refreshing process.

In order to achieve the foregoing object, the noise detection method of the present invention is a noise detection method, including the steps of: storing a logical value with which a noise that is a disturbance is detected; and judging that the noise is detected when the stored logical value changes due to the noise.

With the invention, a change in the stored logical value corresponds to intrusion of the noise that is a disturbance. Consequently, it is possible to properly detect the noise.

In order to achieve the foregoing object, the noise detection device of the present invention is a noise detection device, including a detection storage section for storing a logical value with which a noise that is a disturbance is detected, when the logical value stored in the detection storage section changes due to the noise, the noise detection device outputting a judgment signal indicative of judging that the noise is detected.

With the invention, a change in the logical value stored in the detection storage section corresponds to intrusion of the noise that is a disturbance. Consequently, it is possible to properly detect the noise.

In order to achieve the foregoing object, the semiconductor device of the present invention includes the noise detection device.

With the invention, it is possible to realize a semiconductor device capable of properly detecting a noise.

In order to achieve the foregoing object, the display device of the present invention includes the semiconductor device as a display driving device.

With the invention, it is possible to realize a display device capable of using the result of noise detection for display driving.

A semiconductor device, including a plurality of operational amplifiers each for supplying an output voltage to a display panel, the semiconductor device further including: a storage section in which an offset of an output voltage of the operational amplifier is stored; an offset generation section for generating the offset to be stored in the storage section; and an offset generation control section for supplying, to the offset generation section, a trigger signal indicative of generation of the offset, when a power of the display panel is supplied, when the semiconductor device operates, or when other semiconductor device having a function identical with that of the semiconductor device operates.

With the invention, it is possible to realize a small-scale semiconductor device which is capable of adjusting an offset while absorbing an offset variation, and which does not require a frequent refreshing process.

In order to achieve the foregoing object, the display device of the present invention is a display device, including a semiconductor device that includes a plurality of operational amplifiers each for supplying an output voltage to a display panel, the semiconductor device further including: a storage section in which an offset of an output voltage of the operational amplifier is stored; an offset generation section for generating the offset to be stored in the storage section; and an offset generation control section for supplying, to the offset generation section, a trigger signal indicative of generation of the offset, when a power of the display panel is supplied, when the semiconductor device operates, or when other semiconductor device having a function identical with that of the semiconductor device operates.

With the invention, it is possible to realize a display device with high-quality that uses a small-scale driving device which is capable of carrying out highly reliable offset adjustment.

For a fuller understanding of the nature and advantages of the invention, reference should be made to the ensuing detailed description taken in conjunction with the accompanying drawings.

DESCRIPTION OF THE EMBODIMENTS

The following describes an embodiment of the present invention with reference to FIGS. 1 to 15.

Figure 1:
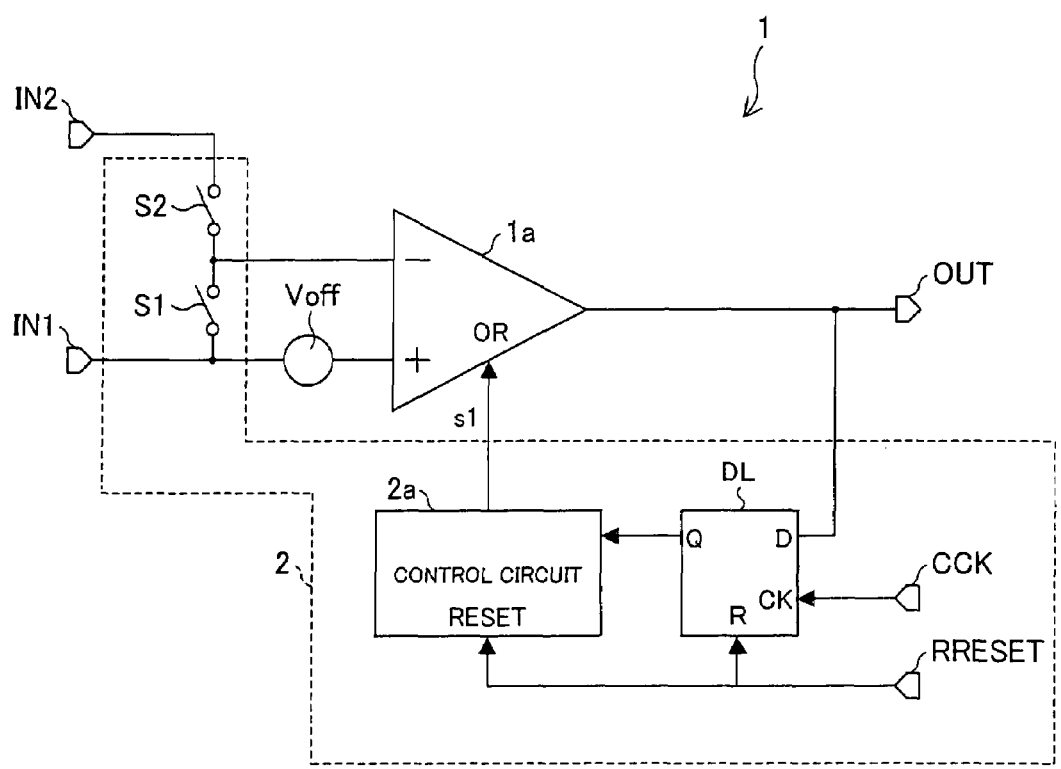
FIG. 1 is a circuit block diagram of an embodiment of the present invention, illustrating a configuration of a main part of an operational amplifier circuit including a first offset adjustment circuit.

FIG. 1 is a circuit block diagram of an embodiment of the present invention, illustrating a configuration of an operational amplifier circuit (offset adjustment device) 1 including a first offset adjustment circuit.

An operational amplifier circuit 1 includes: an operational amplifier 1a; an offset adjustment circuit 2; a common phase input terminal IN1; a negative-phase input terminal IN2; and an output terminal OUT. Note that, an offset of an output voltage of the operational amplifier 1a is represented by a voltage source Voff which serves as a power source for indicating an input offset of a common phase input signal. This voltage source Voff is provided between a non-inverting input terminal of the operational amplifier 1a and the common phase input terminal IN1. Accordingly, a cause of an offset is removed from the operational amplifier 1a itself illustrated in the figure. However, a cause of an offset is actually included inside the operational amplifier 1a. In the following, "operational amplifier 1a in the figure" means that a voltage source Voff is provided as described above.

The common phase input terminal IN1 is a terminal from which a common phase input signal is input to a non-inverting input terminal of the operational amplifier 1a. The negative-phase input terminal IN2 is a terminal from which a negative-phase input signal is input to an inverting input terminal of the operational amplifier 1a.

The operational amplifier 1a includes an offset adjustment input terminal OR. The operational amplifier 1a includes at least a non-inverting input terminal and an inverting input terminal.

The offset adjustment circuit (offset generation section) 2 includes: switching elements S1 and S2; a latch circuit DL; a control circuit 2a; a latch pulse input terminal CCK; and a reset signal input terminal RRESET.

The switching element (first switching element) S1 short-circuits or electrically disconnects (i) an inverting input terminal of the operational amplifier 1a to or from (ii) a non-inverting input terminal of the operational amplifier 1a. In the operational amplifier 1a of the figure, one end, of the switching element S1, on the side of the non-inverting input terminal is connected to a point between the voltage source Voff and the common phase input terminal IN1. The switching element (second switching element) S2 short-circuits or electrically disconnects (i) the inverting input terminal of the operational amplifier 1a to or from (ii) the negative-phase input terminal IN2. Alternatively, the switching element S2 may be provided to short-circuit or electrically disconnect (i) the non-inverting input terminal of the operational amplifier 1a to or from (ii) the common phase input terminal IN1. Namely, the switching element S2 is provided to be capable of disconnecting the inverting input terminal or the non-inverting input terminal from a signal input terminal that, in a normal state of the operational amplifier 1a, corresponds to the inverting input terminal or the non-inverting input terminal.

The latch circuit DL is a logical circuit for latching an output voltage of the operational amplifier 1a, and is configured by a static circuit instead of a dynamic circuit. This latch circuit DL (i) latches, in response to a later-described latch pulse supplied to a clock terminal CK, an output voltage supplied to the input terminal D from the operational amplifier 1a, and (ii) outputs, from the output terminal Q, a logical value corresponding to the latched output voltage. This output signal is a first latch signal. When the output voltage is positive with respect to a reference value, that is, when the output voltage is more than the reference value, the logical value is "1" (first logical value). When the output voltage is negative with respect to the reference value, that is, when the output voltage is not more than the reference value, the logical value is "0" (second logical value). This reference value is an ideal output voltage of the operational amplifier 1a when the operational amplifier 1a serves as a comparator and a differential input is 0. For convenience of explanation, it is assumed that, when the output voltage is equal to the reference value, the logical value is "0". Alternatively, at this time, the logical value may be "1". Alternatively, the first and second logical values may be "0" and "1", respectively. The latch circuit DL constitutes a latch section of the offset adjustment circuit 2. The latch section includes at least one latch circuit.

The control circuit 2a converts a logical value from the latch circuit DL into an offset adjustment signal s1 which is an analog voltage, and supplies the offset adjustment signal s1 to the offset adjustment input terminal OR of the operational amplifier 1a.

A latch pulse for instructing the latch circuit DL to perform a latch operation is input to the latch pulse input terminal CCK. Further, a reset pulse for initializing the latch circuit DL and the control circuit 2a is input to the reset pulse input terminal RRESET. The reset pulse input terminal RRESET is connected to (i) a reset input terminal R of the latch circuit DL and (ii) a reset input terminal RESET of the control circuit 2a.

When an offset adjustment is carried out in the operational amplifier circuit 1 of FIG. 1, the switching element S1 is opened and the switching element S2 is closed, so that the non-inverting input terminal and the inverting input terminal of the operational amplifier 1a are short-circuited with each other while no output-to-input feedback of an output voltage is carried out with respect to the operational amplifier 1a. This allows the operational amplifier 1a to serve as a comparator. With the short-circuit, a differential input voltage of the operational amplifier 1a is 0, and accordingly a deviation of the output voltage of the operational amplifier 1a from the reference value of the output voltage of the operational amplifier 1a can be obtained as an offset. As the operational amplifier 1a serves as a comparator, the gain is very large, allowing an offset to be obtained while the output voltage is saturated. This is advantageous in that, when latching the output voltage of the operational amplifier 1a, the latch circuit DL can latch the saturated output voltage until a time just before the offset is cancelled. The output voltage dropping from a value at which the output voltage has been saturated means that offset adjustment will be soon completed. Consequently, precise binarization is possible.

Further, a reset pulse is input to the reset pulse input terminal RRESET, so as to initialize the latch circuit DL and the control circuit 2a. At this time, when: (i) an open-loop gain of the operational amplifier 1a, that is, a gain of the operational amplifier 1a as a comparator is sufficiently large, and (ii) the operational amplifier 1a has a positive offset voltage, an output voltage of the operational amplifier 1a rises, and is saturated at substantially a positive power source voltage. On the other hand, when: (i) the open-loop gain of the operational amplifier 1a is sufficiently large, and (ii) the operational amplifier 1a has a negative offset voltage, an output voltage of the operational amplifier 1a drops, and is saturated at substantially a negative power source voltage.

These two types of the output voltages are regarded as a binary signal and are associated with a logical value of "1" or "0". In accordance with the output voltage of the operational amplifier 1a, the latch circuit DL latches the logical value, in response to a latch pulse supplied to the latch pulse input terminal CCK. What output voltages the logical values "1" and "0" correspond to have already been explained. When the Q-output from the latch circuit DL is input to the control circuit 2a, the control circuit 2a carries out, in accordance with a logical value indicated by the Q-output, a minute adjustment of the offset adjustment signal s1 so that an offset of the output voltage of the operational amplifier 1a is reduced. After the offset adjustment signal s1 is input to the offset adjustment input terminal OR, the operational amplifier 1a outputs, to the output terminal OUT, an output voltage whose offset has been adjusted. Then, the input of the latch pulse to the latch pulse input terminal CCK and the minute adjustment of the offset adjustment signal s1 are repeated a necessary number of times, so that an offset of the output voltage of the operational amplifier 1a is made as close to zero as possible. During this process, the logical values of "1" and "0" of the logical signal are sequentially accumulated in a multiple-bit latch in the control circuit 2a, and the offset adjustment signal s1 is modified little by little. Here, in the offset adjustment circuit 2, the control circuit 2a includes a storage section for storing therein the binary logical signal. The storage section sequentially latches and stores a first latch signal that is input from the latch circuit DL plural times in a chronological order, and outputs a second latch signal with multiple bits in response to the first latch signal while serially latching the first latch signal. The control circuit 2a generates the offset adjustment signal s1 based on the second latch signal.

As described above, in the offset adjustment circuit 2, the binary logical signal is a logical value obtained by weighting and quantizing each bit. Consequently, by converting the stored logical signal into an analog signal, offset adjustment can be carried out. If an offset is in the positive direction, the latch circuit DL outputs the logical value of "1", and the offset is moved in the negative direction by weighting corresponding to how many times a latch operation has been repeated. Meanwhile, if an offset is in the negative direction, the latch circuit DL outputs the logical value "0", and the offset is moved in the positive direction by the weighting. The moving amount becomes smaller with an increase in the number of latch operation performed.

After the completion of the offset adjustment, the switching element S1 is opened and the switching element S2 is closed. Thus, the operational amplifier 1a enters the normal state. The logical signal data used for the offset adjustment is stored, as logical data, in a storage circuit (not shown) which is provided in the latch circuit DL or the control circuit 2a. After the offset adjustment has been completed once, the state of the offset adjustment is kept.

As a result of not feeding back an output of the operational amplifier 1a to the input thereof, if the operational amplifier circuit 1 is a transconductance amplifier, the output terminal OUT is preferably connected to a load. Here, an offset in the output voltage of the operational amplifier 1a is a deviation in a value of a current from the output terminal OUT. Therefore, the output voltage of the operational amplifier 1a is determined in accordance with the current flowing in a subsequent stage. If the currents, which flow in the PMOS transistor and the NMOS transistor on the output stage, are balanced while no offset occurs in the output voltage of the operational amplifier 1a, the current does not flow in the load, and a problem therefore does not occur. If not so, the current tries to flows in the load. Further, in this case, an abnormal voltage is generated in the output terminal OUT if the output terminal OUT is electrically disconnected from the load.

Figure 2:
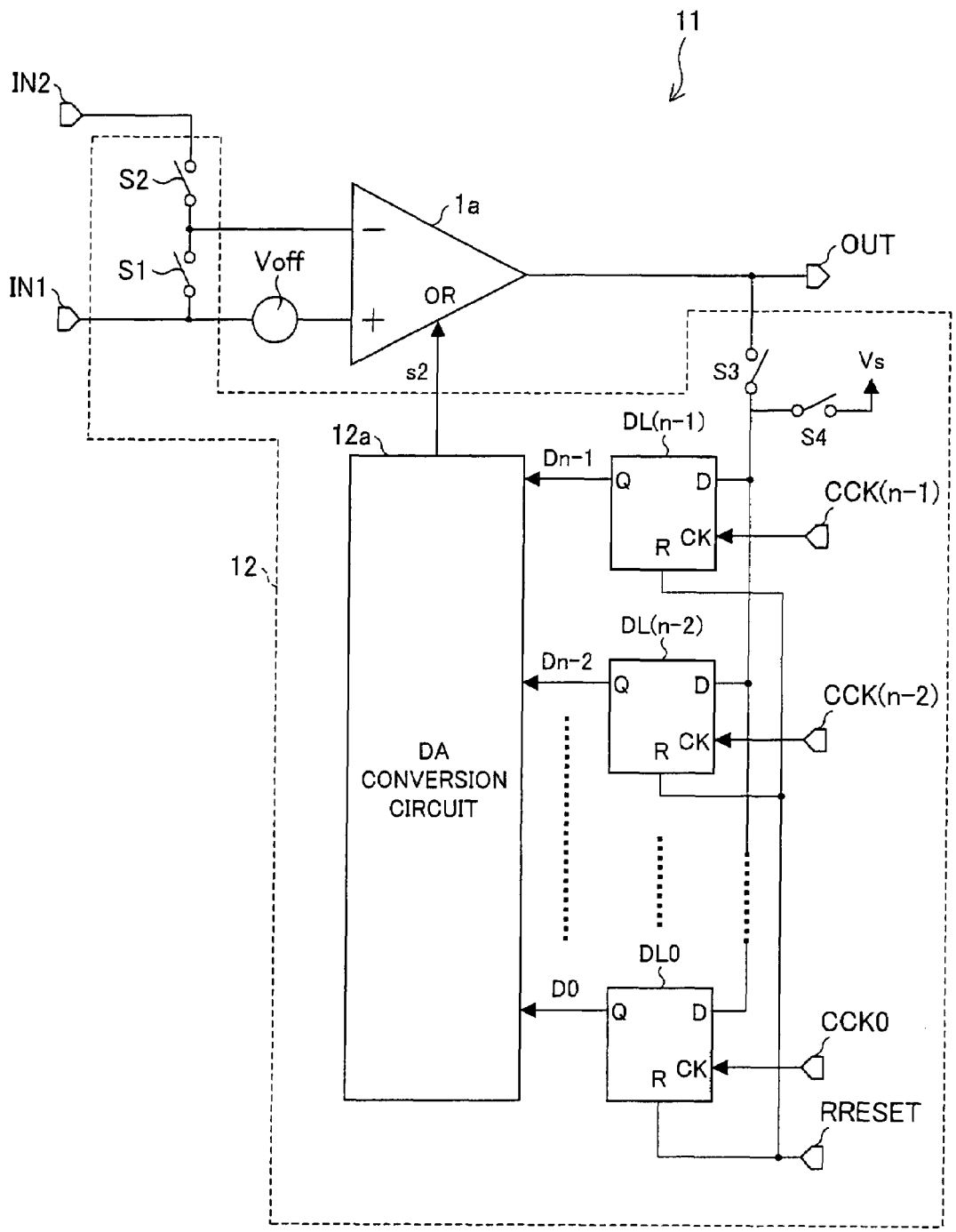
FIG. 2 is a circuit block diagram of an embodiment of the present invention, illustrating a configuration of a main part of an operational amplifier circuit including a second offset adjustment circuit.

FIG. 2 is a drawing of another embodiment of the present invention, illustrating a configuration of an operational amplifier circuit 11 (offset adjustment device) including a second offset adjustment circuit.

The operational amplifier circuit 11 is the same as the operational amplifier circuit 1 of FIG. 1, except in that an offset adjustment circuit 12 is provided instead of the offset adjustment circuit 2. The offset adjustment circuit 12 has the same configuration as that of the offset adjustment circuit 2, except in that the offset adjustment circuit 12 includes n latch circuits DL (n−1) to DL0 instead of the latch circuit DL, and that the offset adjustment circuit 12 includes a DA converter circuit 12a instead of the control circuit 2a. The n latch circuits DL (n−1) to DL0 constitute a storage section. Further, each of the latch circuits DL (n−1) to DL0 is configured by a static circuit. A latch pulse is individually input to latch pulse input terminals CCK (n−1) to CCK0 which are respectively provided to the latch circuits DL (n−1) to DL0. Consequently, it is possible to individually set timing with which a latch operation is carried out. A reset pulse is commonly input to a reset input terminal R that is provided for each of the latch circuits DL (n−1) to DL0. Each output from the latch circuits DL (n−1) to DL0 is a first latch signal and an output including all outputs from the latch circuits DL (n−1) to DL0 is a second latch signal. Each output from the latch circuits DL (n−1) to DL0 is set to a predetermined logical value (e.g. "0") before an output voltage of the operational amplifier 1a is latched.

Further, a switch S3 is provided between an output terminal of the operational amplifier 1a and input terminals D of the latch circuits DL (n−1) to DL0. A switching element S4 is provided between a power source Vs and a point between the switching element S3 and the input terminals D of the latch circuits DL (n−1) to DL0. The power source Vs is a power source for supplying a positive voltage judged by the latch circuits DL (n−1) to DL0 to be "1".

As described above, just before each of the latch circuits DL(n−1) to DL0 latches the output voltage of the operational amplifier 1a, a voltage causing each of the latch circuits DL(n−1) to DL0 to output a first latch signal whose logical value is "1" is input to each of the latch circuits DL(n−1) to DL0. Accordingly, each of the latch circuits DL(n−1) to DL0 outputs the first latch signal regarding that a positive offset exists. Consequently, it is possible to cause each of the latch circuits DL(n−1) to DL0 to function surely, thereby completing offset adjustment.

As described above, in the configuration of FIG. 2, a logical value of a logical signal is temporarily determined, the offset is adjusted in accordance with the logical signal having the temporarily determined logical value, and thereafter determination of the logical value with respect to a subsequent output voltage and offset adjustment in accordance with the logical signal having the determined logical value are repeated, thereby carrying out whole offset adjustment.

As the logical value of the logical signal is temporarily determined, it is possible to compulsorily generate an offset corresponding to the logical signal having the temporarily determined logical signal. Then, a logical value corresponding to the result of adjustment of the generated offset is determined, and an offset corresponding to the logical signal having the determined logical value is adjusted. The determination of the logical value and the adjustment of the offset are carried out repeatedly. Consequently, it is possible to carry out offset adjustment while gradually reducing offset toward 0.

The latch circuits DL (n−1) to DL0 function as an n-bit latch circuit. Each of the latch circuits DL (n−1) to DL0 latches, in response to an input of a latch pulse, an output voltage input to the input terminal D from the operational amplifier 1a. When the output voltage is positive, "1" is output from the output terminal Q. When the output voltage is negative, "0" is output from the output terminal Q. Among the output signals Dn−1 to D0 respectively output from the latch circuits DL (n−1) to DL0, the output signal Dn−1 is the most significant bit and the output signal D0 is the least significant bit. These output signals are binary-weighted logical values. The output signals Dn−1 to D0 are input to the DA converter circuit 12a, as a binary logical signal which includes these logical values.

As described above, in the offset adjustment circuit 12a, the binary logical signal includes logical values whose bit is weighted and quantized.

The DA converter (control circuit) 12a performs a digital-analog conversion with respect to the digital output signals Dn−1 to D0, so as to generate an offset adjustment signal s2 which is an analog voltage. Then, the DA converter (control circuit) 12a inputs the generated offset adjustment signal s2 to the offset adjustment input terminal OR of the operational amplifier 1a. The offset adjustment signal s2 is a total of bit-based voltages. The bit-based voltages include (i) a voltage, based on a bit of "1", which moves an offset in the negative direction by an amount corresponding to how the bit is weighted; and/or (ii) a voltage, based on a bit of "0", which causes no movement of the offset.

When an offset adjustment is carried out in the operational amplifier circuit 11 of FIG. 2, the switching element S2 is opened and the switching element S1 is closed, so that the non-inverting input terminal and the inverting input terminal of the operational amplifier 1a are short-circuited, while no output-to-input feedback is carried out with respect to the operational amplifier 1a. Further, the reset pulse is input to the reset pulse input terminal RRESET, so as to (i) initialize the latch circuits DL (n−1) to DL0, and (ii) reset the output signals Dn−1 to D0 at "0". At this time, the DA converter circuit 12a outputs an offset adjustment signal s2 which corresponds to an n-bit binary digit "00 . . . 0", and supplies the offset adjustment signal s2 to the offset adjustment input terminal OR. Here, when a signal "00 . . . 0" is input to the DA converter circuit 12a, the output voltage of the operational amplifier 1a has the strongest positive offset. In this case, the output voltage of the operational amplifier 1a rises to the positive power source voltage, and is saturated.

Next, by opening the switch S3 and closing the switch S4, an input of the latch circuit DL(n−1) is made "1". Then, a latch pulse is input to the latch pulse input terminal CCK (n−1), so that the latch circuit DL (n−1) latches a voltage from the voltage source Vs. A signal input to the DA converter circuit 12a changes to "10 . . . 0". Since the most significant bit is "1", the offset adjustment signal s2 (i.e. output signal from the DA converter circuit 12a) causes the offset in the output voltage of the operational amplifier 1a to move in the negative direction by an amount corresponding to the most significant bit. At this time, if the offset is still in the positive direction, the output voltage rises and is saturated at the positive power source voltage. On the other hand, if the offset is negative, the output voltage drops and is saturated at the negative power source voltage.

Subsequently, the switch S4 is opened and the switch S3 is closed, and then a latch pulse is input to the latch pulse input terminal CCK(n−1) and the latch circuit DL(n−1) latches the output voltage of the operational amplifier 1a. When the output voltage of the operational amplifier 1a is saturated at a positive value, the output signal Dn−1 of the latch circuit DL(n−1) continues to be "1". When the output voltage of the operational amplifier 1a is saturated at a negative value, the output signal Dn−1 of the latch circuit DL(n−1) becomes "0".

Next, similarly, by opening the switch S3 and closing the switch S4, an input of the latch circuit DL(n−2) is made "1". Then, a latch pulse is input to the latch pulse input terminal CCK (n−2), so that the latch circuit DL (n−2) latches the voltage from the voltage source Vs 1a. A signal input to the DA converter circuit 12a changes to "11 . . . 0". Since the second most significant bit is "1", the offset adjustment signal s2 (i.e. output signal from the DA converter circuit 12a) causes the offset in the output voltage of the operational amplifier 1a to move in the negative direction by an amount corresponding to the second most significant bit. At this time, if the offset is still in the positive direction, the output voltage rises and is saturated at the positive power source voltage. On the other hand, if the offset is negative, the output voltage drops and is saturated at the negative power source voltage.

Subsequently, the switch S4 is opened and the switch S3 is closed, and then a latch pulse is input to the latch pulse input terminal CCK(n−2) and the latch circuit DL(n−2) latches the output voltage of the operational amplifier 1a. When the output voltage of the operational amplifier 1a is saturated at a positive value, the output signal Dn−2 of the latch circuit DL(n−2) continues to be "1". When the output voltage of the operational amplifier 1a is saturated at a negative value, the output signal Dn−2 of the latch circuit DL(n−2) becomes "0".

In this way, it is confirmed whether the output voltage of the operational amplifier 1a becomes positive or negative as a result of offset adjustment with the output signal being "1". When the output voltage becomes positive, the bit is set to "1". When the output voltage becomes negative, the bit is set to "0".

In this way, data to be retained in the latch circuits are sequentially determined from the upper bit to the lower bit. This makes an offset of the output voltage of the operational amplifier 1a as close to zero as possible.

After the value of the least significant bit D0 is determined, the switching element S1 is opened and the switching element S2 is closed. Thus, the operational amplifier 1a enters the normal state. The offset adjustment data is saved, in the form of n-bit binary data, in the latch circuits DL (n−1) to DL0. Once the offset adjustment is completed, the offset adjustment data stored in the latch circuits DL(n−1) to DL0 is maintained. Here, in the offset adjustment circuit 12, the latch circuits DL (n−1) to DL0 serve as a storage circuit which stores the binary logical signal.

In this way, in the operational amplifier circuit 11, each of the latch circuits DL(n−1) to DL0 carries out a latch operation one by one. Because each of the latch circuits DL(n−1) to DL0 latches an offset once, it is possible to carry out weighting in each latch circuit. Consequently, it is possible to carry out offset adjustment gradually and precisely.

In the above configuration, the output voltage of the operational amplifier 1a has the strongest positive offset when the input signal from the DA converter circuit 12a is "00 . . . 0". However, the present invention is not limited to this. It is possible that the output voltage of the operational amplifier 1a has the strongest negative offset when the input signal from the DA converter circuit 12a is "00 ... 0". In this case, if the offset in the output voltage of the operational amplifier 1a is in the negative direction, each of the latch circuits DL (n−1) to DL0 outputs "1", and the DA converter circuit 12a assigns, to the corresponding bit, a voltage which moves the offset in the positive direction. On the other hand, if the offset in the output voltage of the operational amplifier 1a is in the positive direction, each of the latch circuits DL (n−1) to DL0 outputs "0", and the DA converter circuit 12a assigns, to the corresponding bit, a voltage which causes the offset not to move. Further, since the logical values are not limited as long as they are distinguishable. Therefore, the logical values of "1", and "0" may be used other way around.

Figure 3:
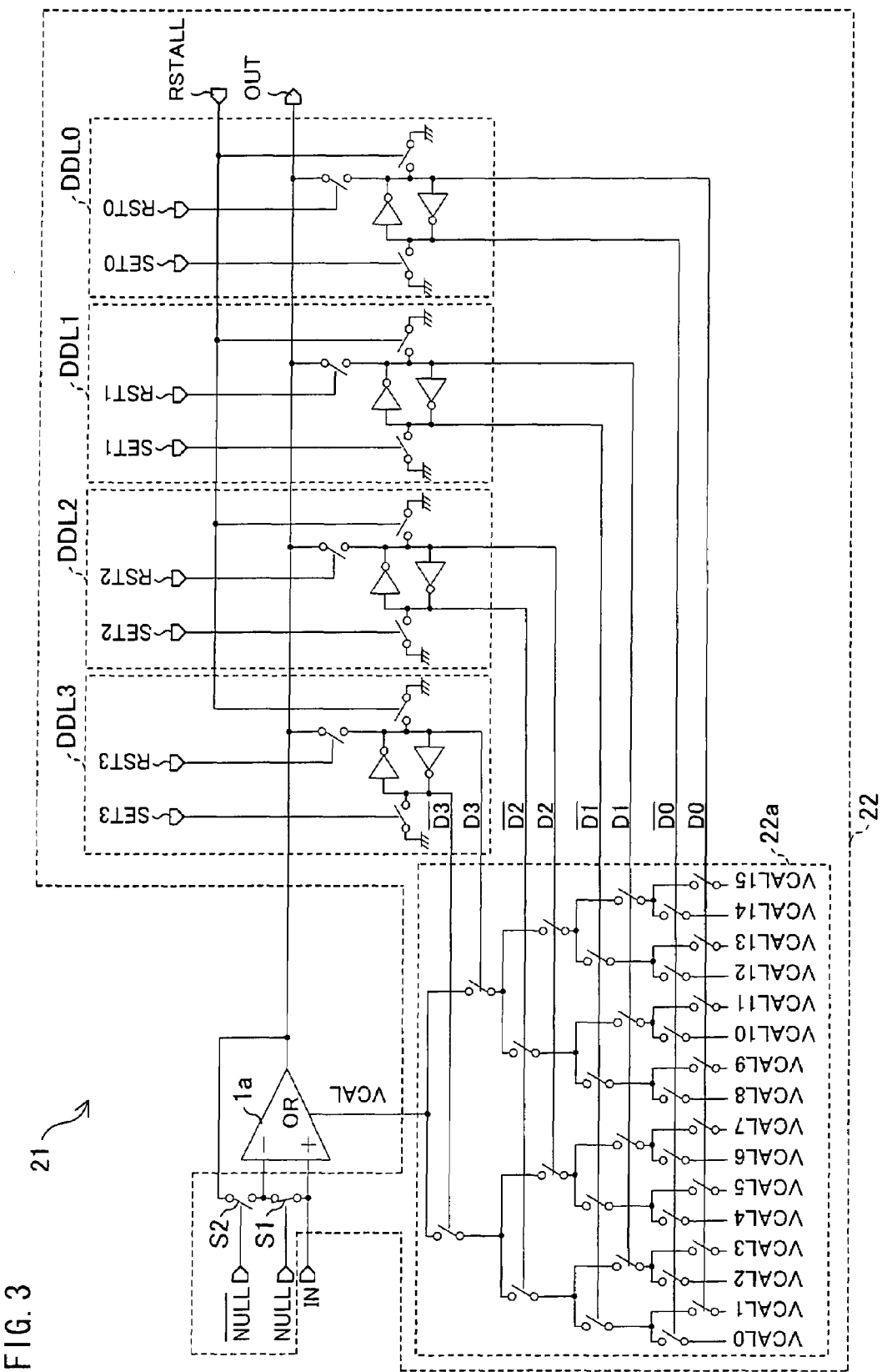
FIG. 3 is a circuit block diagram of an embodiment of the present invention, illustrating a configuration of a main part of an operational amplifier circuit including a third offset adjustment circuit.

FIG. 3 is a drawing of further another embodiment of the present invention, illustrating a configuration of an operational amplifier circuit (offset adjustment device) 21 including a third offset adjustment circuit.

The operational amplifier circuit 21 is the operational amplifier circuit 11 of FIG. 2 being configured in the form of a voltage follower circuit with a use of the operational amplifier 1a. This operational amplifier circuit 21 includes an offset adjustment circuit 22 instead of the offset adjustment circuit 12. The offset adjustment circuit (offset generation section) 22 includes: latch circuits DDL3 to DDL0 instead of the latch circuits DL (n−1) to DL0 of the offset adjustment circuit 12; and a DA converter 22a instead of the DA converter circuit 12a of the offset adjustment circuit 12. Further, each of the latch circuits DDL3 to DDL0 is configured by a static circuit.

Further, a signal for controlling on/off statuses of the switching element S1 is referred to as signal NULL, and a signal for controlling on/off statuses of the switching element S2 is referred to as signal /NULL (NULL bar) which is an inverted signal of the signal NULL.

In response to a set signal supplied to the set input terminals SETk (where k=1, 2, 3, or 4), each of the latch circuits DDLk outputs: (i) output data Dk which is a High-level voltage (logical value of "1"), and (ii) output data/Dk (Dk bar) which is a Low-level voltage (logical value of "0"). Further, in response to a reset signal supplied to the reset input terminals RSTk, each of the latch circuits DDLk latches an output voltage of the operational amplifier 1a and regards the output voltage as a logical value of "1" or "0". If the output voltage is regarded as "1", a High-level voltage is output as output data Dk. On the other hand, if the output voltage is regarded as "0", a Low-level voltage is output as output data Dk. Meanwhile, each of the latch circuits DDLk outputs the output data /Dk (Dk bar) whose value is an inversion of the logical value of the output data Dk. Further, in response to a reset signal supplied from a reset input terminal RSTALL which is common for all of the latch circuits DDLk, each of the latch circuits DDLk outputs in unison (i) the output data Dk which is the Low-level voltage, and (ii) the output data /Dk (Dk bar) which is the High-level voltage. Once the set signal is input to the latch circuits DDLk, the output data Dk and the output data /Dk (Dk bar) are respectively maintained at the high-level voltage and the low-level voltage, until an input of a reset signal from the reset input terminal RSTk or the reset input terminal RSTALL. Further, once the reset signal is input to the latch circuits DDLk via the reset input terminal RSTALL, the output data Dk and the output data /Dk (Dk bar) are respectively maintained at the low-level voltage and the high-level voltage, until an input of the set signal.

In accordance with the output data D3 to D0 and the output data /D3 to /D0 respectively from the latch circuits DDL3 to DDL0, the DA converter (control circuit) 22a selects an analog voltage level of an offset adjustment signal VCAL to be input to an offset adjustment input terminal OR of the operational amplifier 1a. Then, the DA converter 22a outputs the offset adjustment signal VCAL. With 4 bits of the output data D3 to D0 from the latch circuits DDL3 to DDL0, it is possible to express 16 analog voltage levels. As such, there are voltages VCAL0 to VCAL15 as the offset adjustment signal VCAL. Here, the voltage level VCAL0 is the highest and the voltage level descends in the order of VCAL0, VCAL1, ... VCAL15. Further, it is supposed that the output data D3 is the most significant bit, followed by the output data D2, and the output data piece D1. The least significant bit is the output data D0.

The DA converter 22a includes many switching elements which are arranged in a tree-like manner. In response to the output data D3 to D0 and /D3 to /D0, these switching elements are switched on/off so as to form a path for inputting, to the offset adjustment input terminal OR, any one of voltages VCAL0 to VCAL15 which corresponds to the output data. Each of the switching elements is switched to the on-state while the output data input is a High-level voltage, and is switched to the off-state while the output data input is a Low-level voltage. The offset adjustment signal VCAL is input to the offset adjustment input terminal OR, sequentially from the VCAL0 to VCAL15, in accordance with a size of a binary number expressed in 4 bits of the output data D3 to D0. Further, an amount of the offset moved in the positive direction by the offset adjustment signal VCAL is higher in the order of the VCAL0 to VCAL15.

Figure 4:
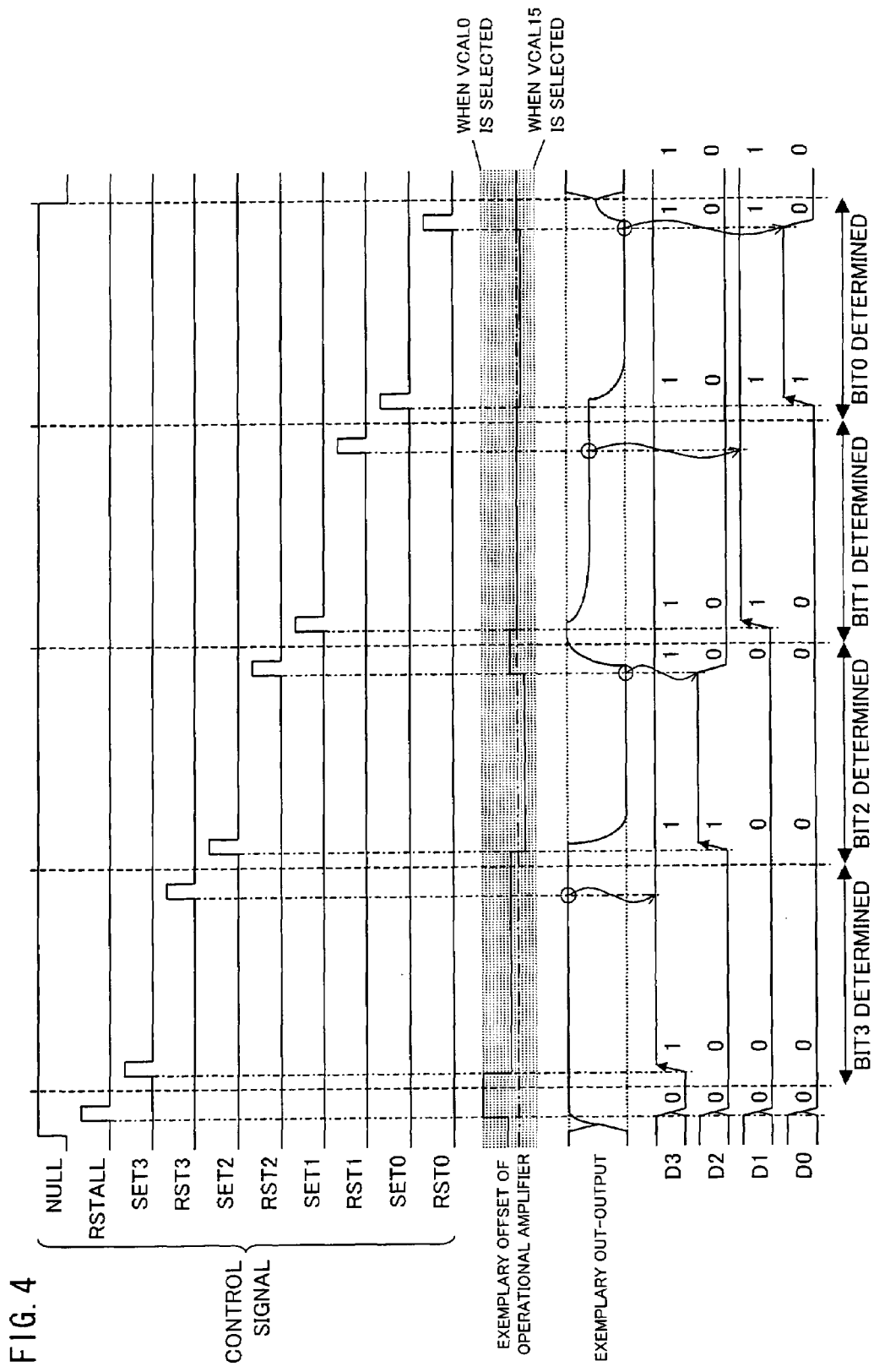
FIG. 4 is a timing chart of signals, explaining an offset adjustment operation carried out by the operational amplifier circuit in FIG. 3.

FIG. 4 is a timing chart illustrating an operation of the operational amplifier circuit 21 of FIG. 3. An operation of the operational amplifier circuit 21 is the same as that of the operational amplifier circuit 12 of FIG. 2, except in that a value of one bit is determined by separately inputting, once each, a set signal and a reset signal instead of inputting twice the latch pulse CCK. In other words, in the operational amplifier circuit 21, a set input terminal SETk and a reset terminal RSTALL are provided, so that the logical signal latched by the latch circuits DDLk can be set independently of the output voltage of the operational amplifier 1a.

First, as illustrated in FIG. 4, the signal NULL is a High-level voltage, and the signal/NULL is a Low-level voltage, so that the switching element S1 is closed and the switching element S2 is opened. Thus, the non-inverting input terminal and the inverting input terminal of the operational amplifier 1a are short-circuited, while the output-to-input feedback is not carried out with respect to the operational amplifier 1a. Then, a High level voltage is input as a reset signal to the latch circuits DDL3 to DDL0 via the reset input terminal RSTALL. Consequently, the output data D3 to D0 are the Low-level voltage, and the output data /D3 to /D0 are the How-level voltage. Thus, the voltage VCAL0 is selected as the offset adjustment signal VCAL. When the voltage VCAL0 is used for adjusting the offset in the output voltage of the operational amplifier 1a, the strongest positive offset occurs in the output voltage, as indicated by "EXEMPLARY OFFSET OF OPERATIONAL AMPLIFIER" in FIG. 4. At this time, the output voltage is saturated in the positive direction as indicated by "EXEMPLARY OUT-OUTPUT" in FIG. 4.

Subsequently, the High-level voltage is input as a set signal to the latch circuit DDL3 via the set input terminal SET3, so that a signal containing 4 bits of the output data D3 to D0 is "1000". Thus, the voltage VCAL8 is selected as the offset adjustment signal VCAL. When the voltage VCAL8 is input to the offset adjustment input terminal OR, the offset in the output voltage of the operational amplifier 1a moves in the negative direction. In this case, the remaining offset in the output voltage is in the positive direction as indicated by "EXEMPLARY OFFSET OF OPERATIONAL AMPLIFIER" in FIG. 4. Further, the output voltage is still saturated in the positive direction as indicated by "EXEMPLARY OUT-OUTPUT". For the purpose of confirming in which direction (positive or negative direction) the offset occurs, a High level voltage is input as a reset signal to the latch circuit DDL3 via the reset input terminal RST3, so that the latch circuit DDL3 latches the output voltage of the operational amplifier 1a. If the output voltage, at this time, is saturated in the positive direction as indicated by "EXEMPLARY OUT-OUTPUT" in FIG. 4, the output data D3 from the latch circuit DDL3 is "1". Therefore, the output data D3 (Bit3) is determined to be "1" and is maintained at "1". The output voltage of the operational amplifier 1a, in this case, remains at the value resulted from the adjustment by using the offset adjustment signal VCAL (voltage VCAL8) which corresponds to "1000".

In a case where a High-level voltage is input as a reset signal to the latch circuit DDL3 via the reset input terminal RST 3, when the output voltage is saturated in the negative direction, the output data D3 from the latch circuit DDL3 is "0". Therefore, the output data D3 (Bit3) is determined to be "0", and is maintained at "0". At this time, the output voltage of the operational amplifier 1a returns to the value resulted from the adjustment by using the offset adjustment signal VCAL (voltage VCAL0) which corresponds to "0000".

Next, a set signal of the High-level voltage is input to the latch circuit DDL2 via the set input terminal SET2, so that a signal containing 4 bits of the output data D3 to D0 is "1100". Thus, the voltage VCAL12 is selected as the offset adjustment signal VCAL. When the voltage VCAL12 is input to the offset adjustment input terminal OR, the offset in the output voltage of the operational amplifier 1a moves in the negative direction. In this case, the remaining offset in the output voltage is in the negative direction as indicated by "EXEMPLARY OFFSET OF OPERATIONAL AMPLIFIER" in FIG. 4. Further, the output voltage is saturated in the negative direction as indicated by "EXEMPLARY OUT-OUTPUT". For the purpose of confirming in which direction (positive or negative direction) the offset occurs, a High level voltage is input as a reset signal to the latch circuit DDL2 via the reset input terminal RST2, so that the latch circuit DDL2 latches the output voltage of the operational amplifier 1a. If the output voltage, at this time, is saturated in the negative direction as indicated by "EXEMPLARY OUT-OUTPUT" in FIG. 4, the output data D2 from the latch circuit DDL2 is "0". Therefore, the output data D2 (Bit2) is determined to be "0" and is maintained at "0". The output voltage of the operational amplifier 1a, in this case, returns to the value resulted from the adjustment by using the offset adjustment signal VCAL (voltage VCAL8) which corresponds to "1000".

In a case where a reset signal of a High-level voltage is input to the latch circuit DDL2 via the reset input terminal RST2 so that the latch circuit DDL2 latches the output voltage of the operational amplifier 1a, when the output voltage is saturated in the positive direction, the output data D2 from the latch circuit DDL2 is "1". Therefore, the output data D2 (Bit2) is determined to be "1", and is maintained at "1". The output voltage of the operational amplifier 1a, in this case, remains at the value resulted from the adjustment by using the offset adjustment signal VCAL (voltage VCAL12) which corresponds to "1100".

Next, a set signal of the High-level voltage is input to the latch circuit DDL1 via the set input terminal SET1, so that a signal containing 4 bits of the output data D3 to D0 is "1010". Thus, the voltage VCAL10 is selected as the offset adjustment signal VCAL. When the voltage VCAL10 is input to the offset adjustment input terminal OR, the offset in the output voltage of the operational amplifier 1a moves in the negative direction. In this case, the remaining offset in the output voltage is slightly in the positive direction as indicated by "EXEMPLARY OFFSET OF OPERATIONAL AMPLIFIER" in FIG. 4 (the offset, in the figure, is almost zero, however it is assumed that the offset is slightly in the positive direction). Further, the output voltage is no longer saturated, and is dropped down to a region where the output voltage linearly varies, as indicated by "EXEMPLARY OUT-OUTPUT". For the purpose of confirming in which direction (positive or negative direction) the offset remains, a High-level voltage is input as a reset signal to the latch circuit DDL1 via the reset input terminal RST1, so that the latch circuit DDL1 latches the output voltage of the operational amplifier 1a. If the output voltage, at this time, is in the positive direction as indicated by "EXEMPLARY OUT-OUTPUT" in FIG. 4, the output data D1 from the latch circuit DDL1 is "1". Therefore, the output data D1 (Bit1) is determined to be "1" and is maintained at "1". The output voltage of the operational amplifier 1a, in this case, remains at the value resulted from the adjustment by using the offset adjustment signal VCAL (voltage VCAL10) which corresponds to "1010".

In a case where a High-level voltage is input as a reset signal to the latch circuit DDL1 via the reset input terminal RST1 so that the latch circuit DDL1 latches the output voltage of the operational amplifier 1a, when the output voltage is in the negative direction, the output data D1 from the latch circuit DDL1 is "0". Therefore, the output data D1 (Bit1) is determined to be "0", and is maintained at "0". At this time, the output voltage of the operational amplifier 1a returns to a value resulted from the adjustment by using the offset adjustment signal VCAL (voltage VCAL8) which corresponds to "1000".

Next, a set signal of the High-level voltage is input to the latch circuit DDL0 via the set input terminal SET0, so that a signal containing 4 bits of the output data D3 to D0 is "1011". Thus, the voltage VCAL11 is selected as the offset adjustment signal VCAL. When the voltage VCAL11 is input to the offset adjustment input terminal OR, the offset in the output voltage of the operational amplifier 1a moves in the negative direction. In this case, the remaining offset in the output voltage is in the negative direction as indicated by "EXEMPLARY OFFSET OF OPERATIONAL AMPLIFIER" in FIG. 4. Further, the output voltage is saturated in the negative direction as indicated by "EXEMPLARY OUT-OUTPUT". For the purpose of confirming in which direction (positive or negative direction) the offset remains, a High-level voltage is input as a reset signal to the latch circuit DDL0 via the reset input terminal RST0, so that the latch circuit DDL0 latches the output voltage of the operational amplifier 1a. If the output voltage, at this time, is saturated in the negative direction as indicated by "EXEMPLARY OUT-OUTPUT" in FIG. 4, the output data D0 from the latch circuit DDL0 is "0". Therefore, the output data D0 (Bit0) is determined to be "0" and is maintained at "0". The output voltage of the operational amplifier 1a, in this case, returns to the value resulted from the adjustment by using the offset adjustment signal VCAL (of the voltage VCAL10) which corresponds to "1010".

In a case where a High-level voltage is input as a reset signal to the latch circuit DDL0 via the reset input terminal RST0 so that the latch circuit DDL0 latches the output voltage of the operational amplifier 1a, when the output voltage is saturated in the positive direction, the output data D0 from the latch circuit DDL0 is "1". Therefore, the output data D0 (Bit0) is determined to be "1" and is maintained at "1". The output voltage of the operational amplifier 1a, in this case, remains at the value resulted from the adjustment by using the offset adjustment signal VCAL (of the voltage VCAL11) which corresponds to "1011".

In this way, a 4-bit logical signal is determined. In the above method, whether or not each bit is "1" or "0" is determined as follows. Namely, when each of the latch circuits DDLk latches the output voltage of the operational amplifier 1a from the corresponding reset input terminal RSTk, an amount of voltage correction, which voltage corresponding to how the corresponding bit is weighted, is subtracted from the output voltage of the operational amplifier 1a. Then, whether or not each bit is "1" or "0" is determined based on whether or not the subtraction results in a negative value or a positive value. Accordingly, the value remaining after subtracting the voltage adjustment amount does not necessarily have to be saturated in the positive or negative direction. Note, however, that the output voltage in general is easily saturated, when the open-loop gain of the operational amplifier 1a is remarkably large. This is because a region in which the output voltage linearly varies with respect to the input differential voltage is extremely narrowed. Here, as in the offset adjustment circuit 12, the binary logical signal is a logical value quantized by using the weighted offset adjustment amount.

The output data D3 to D0 and /D3 to /D0 stored in the latch circuits DDL3 to DDL0 are kept being stored. Further, the switching element S1 is opened and the switching element S2 is closed, so that the operational amplifier circuit 21 operates as a voltage follower whose offset has been adjusted.

It is possible to eliminate, from the offset adjustment circuit 22 of FIG. 3, the set input terminal SETk and circuit elements therefore, so that the offset adjustment circuit 22 operates in the same manner as the offset adjustment circuit 12 of FIG. 2. Further, FIG. 3 deals with a case where the 4-bit adjustment data is determined and stored. However, it is needless to say that the number of bits can be easily modified.

Further, in the offset adjustment circuit 22, the latch circuits DDL3 to DDL0 serve as a storage circuit for storing the binary logical signal. However, the present invention is not limited to this, and the storage circuit may be in the DA converter 22a, or in both of (i) the latch circuit DDL3 to DDL0 and (ii) the DA converter 22a. In short, the storage circuit is not particularly limited as long as it is a part of a circuit including the latch circuits DDL3 to DDL0 and the DA converter 22a.

Figure 5:
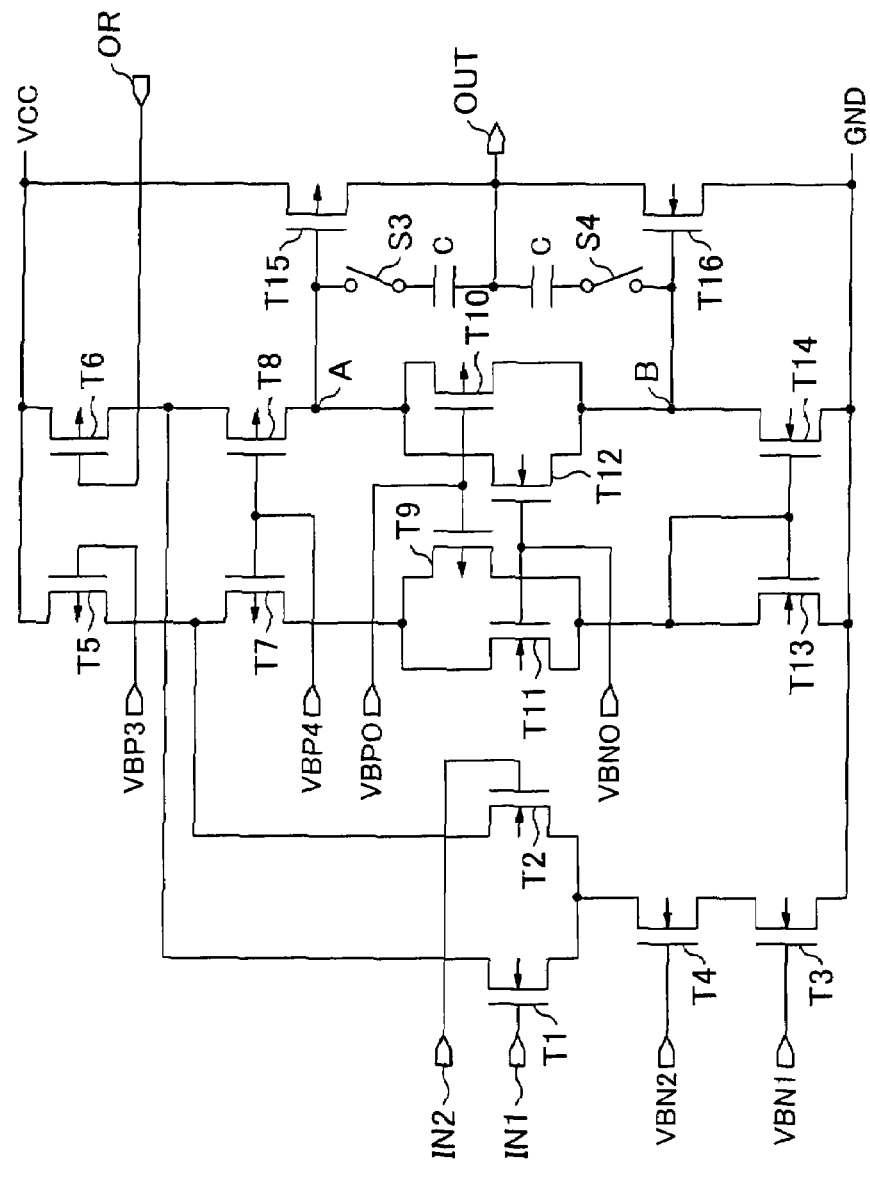
FIG. 5 is a circuit diagram illustrating an example of a configuration of an operational amplifier having an offset adjustment function.

Next, FIG. 5 illustrates an example of an operational amplifier used in the present embodiment having an offset adjusting function. The operational amplifier illustrated in FIG. 5 can be used as the operational amplifier 1a illustrated in FIGS. 1 to 3. This operational amplifier is a widely known operational amplifier so-called "folded cascode operational amplifier". Note that the circuit configuration and the offset adjustment input process performed in this operational amplifier is no more than a typical example, and an applicable scope of the present invention is not limited to such a circuit illustrated in FIG. 5.

NMOS transistors T1 and T2 form differential pair transistors. The gate of the NMOS transistor T1 serves as a common phase input terminal IN1 (i.e. non-inverting input terminal), and the gate of the NMOS transistor T2 serves as the negative-phase input terminal IN2 (i.e. inverting input terminal). Between (i) the sources of the NMOS transistors T1 and T2 and (ii) the GND, NMOS transistors T3 and T4 are serially connected. To the gate of the NMOS transistor T3, a voltage VBN1 is input. Further, to the gate of the NMOS transistor T4, a voltage VBN2 is input.

The drain of the NMOS transistor T1 is connected to the drain of a PMOS transistor T5, and the drain of the NMOS transistor T2 is connected to the drain of a PMOS transistor T6. The sources of the PMOS transistors T5 and T6 are connected to a power supply VCC. To the gate of the PMOS transistor T5, a voltage VBP3 is input. The gate of the PMOS transistor T6 serves as an offset adjustment input terminal OR.

Between the GND and the respective drains of the PMOS transistors T5 and T6, there are provided: (i) a pair of PMOS transistors T7 and T8; (ii) a pair of (a) a parallel circuit of a PMOS transistor T9 and an NMOS transistor T11 and (b) a parallel circuit of a PMOS transistor T10 and an NMOS transistor T12; and (iii) a current mirror circuit including NMOS transistors T13 and T14, each of which is connected in this order.

The source of the PMOS transistor T7 is connected to the drain of the PMOS transistor T5, and the source of the PMOS transistor T8 is connected to the drain of the PMOS transistor T6. To the respective gates of the PMOS transistors T7 and T8, a voltage VBP4 is input. The source of the PMOS transistor T9 and the drain of the NMOS transistor T11 are connected to the drain of the PMOS transistor T7, and the source of the PMOS transistor T10 and the drain of the NMOS transistor T12 are connected to the drain of the PMOS transistor T8 via a point-A. To the gates of the PMOS transistors T9 and T10, a voltage VBP0 is input. Further, to the gates of the NMOS transistors T11 and T12, a voltage VBN0 is input. The drain of the NMOS transistor T13 is connected to (i) the drain of the PMOS transistor T9 and (ii) the source of the NMOS transistor T11. The drain of the NMOS transistor T14 is connected, via a point-B, to (i) the drain of the PMOS transistor T10 and (ii) the source of the NMOS transistor T12. The gates of the NMOS transistors T13 and T14 are connected to each other, and are connected to the drain of the NMOS transistor T13. The sources of the NMOS transistors T13 and T14 are connected to the GND.

Further, the output stage of the operational amplifier is a PMOS transistor T15 and an NMOS transistor T16 which are serially connected between the power source VCC and the GND. The gate of the PMOS transistor T15 is connected to the point-A, and the gate of the NMOS transistor T16 is connected to the point-B. The source of the PMOS transistor T15 is connected to the power source VCC, and the source of the NMOS transistor T16 is connected to the GND. The drain of the PMOS transistor T15 and the drain of the NMOS transistor T16 are connected to each other, and their node serves as the output terminal OUT of the operational amplifier.

Further, in the operational amplifier, two phase compensating capacitors C for preventing an oscillation are provided between the point-A and the point-B. More specifically, one of the phase compensating capacitors C is provided between the point-A and the output terminal OUT, and another one of the phase compensating capacitors C is provided between the point-B and the output terminal OUT. Further, a switching element S3 is interposed between (i) the point-A and (ii) the phase compensating capacitor C which is between the point-A and the output terminal OUT. Further, a switching element S4 is interposed between (i) the point-B and (ii) the phase compensating capacitor C which is between the point-B and the output terminal OUT.

These switching elements S3 and S4 are for disconnecting the operational amplifier from the phase compensating capacitor C, while the offset adjustment operation explained with reference to FIG. 1 to FIG. 3 is performed. The disconnection of the operational amplifier from the phase compensating capacitor C improves a high-frequency property of the operational amplifier, thus improving its through rate. This allows a quicker response of an output voltage with respect to the signal input to the offset adjustment input terminal. Thus, it is possible to carry out offset adjustment shown in the timing chart at a shorter time. In FIG. 2 or FIG. 3, this effect of the accelerated response is particularly remarkable in the offset adjustment using the lower bit, in which a remaining offset voltage is small.

As described, in the offset adjustment circuits 2, 12, and 22 of the present embodiment, an offset in the output voltage of the operational amplifier 1a is converted into a binary logical signal, and the binary logical signal is stored. Then, by using the stored logical signal, the offset in the output voltage is adjusted. This method does not require a frequent refreshing process which is required in a case of storing an analog voltage. Further, since a case-by-case offset adjustment can be performed, a random variation in the offset is reduced. This is advantageous because designing of a remarkably large-sized element is unnecessary, and no particular consideration is needed in designing mask layout of an LSI. Consequently, it is possible to reduce a chip size and a cost.

Thus, it is possible to realize a small-scale offset adjustment circuit which is capable of adjusting an offset while absorbing an offset variation, and which does not require a frequent refreshing process.

The following explains a configuration for repeating the offset adjustment with desired timing.

Figure 6:
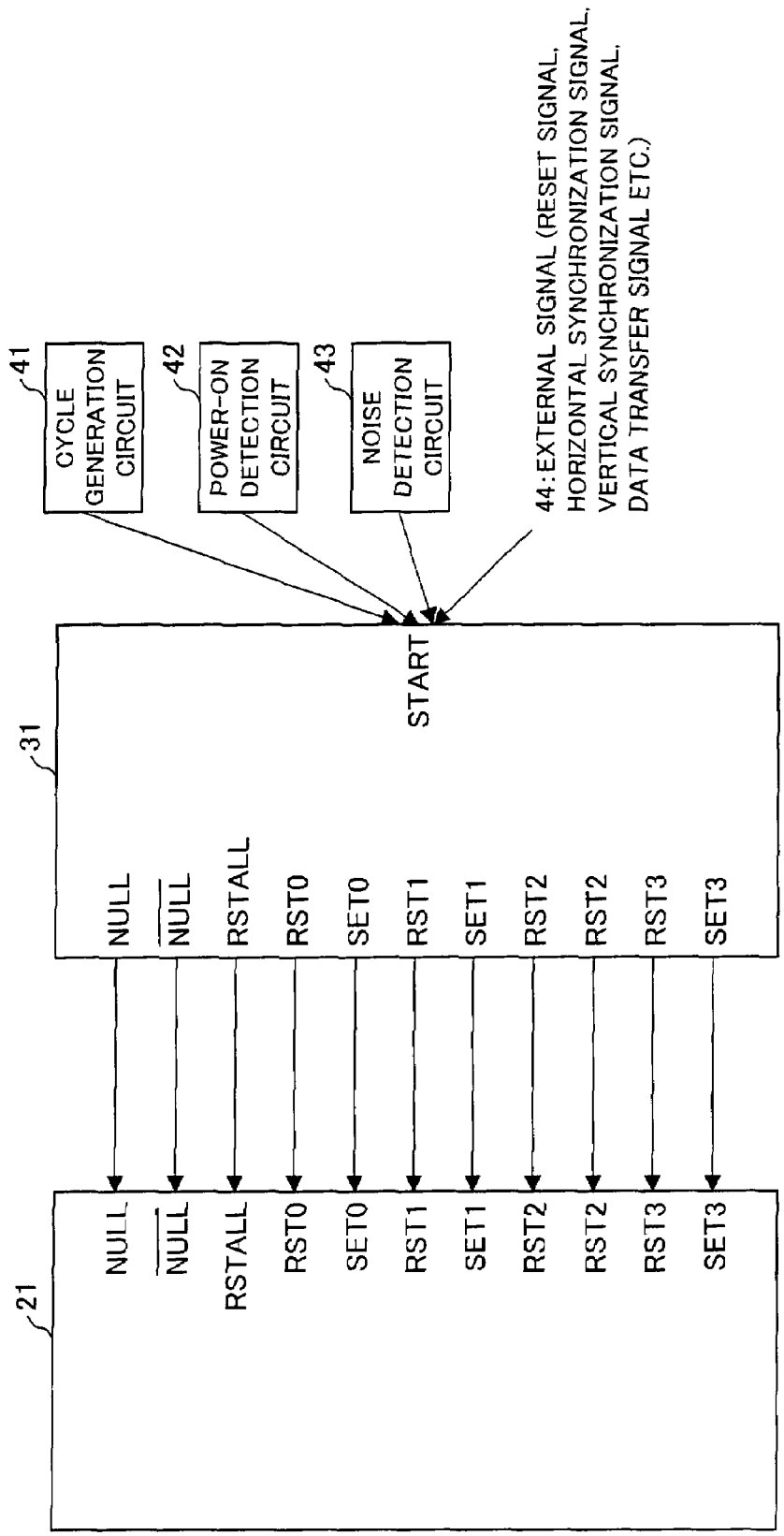
FIG. 6 is a block diagram illustrating a configuration for controlling timing with which offset adjustment is carried out.

FIG. 6 shows an example of a configuration of the offset adjustment circuit 22 in FIG. 3 to repeatedly carry out offset adjustment. FIG. 6 shows the offset adjustment circuit 22 provided with an offset data collection control circuit (offset generation control section) 31. Further, in accordance with the provision of the offset data collection control circuit 31, one or more of (i) addition of a cycle generation circuit 41, (ii) addition of a power-on detection circuit 42, (iii) addition of a noise detection circuit 43, and (iv) input of an external signal 44, is carried out.

The cycle generation circuit 41, the power-on detection circuit 42, and the noise detection circuit 43 serve as trigger signal generation means for generating a trigger signal indicative of timing with which offset adjustment of the output voltage of the operational amplifier 1a is carried out. With the trigger signal generated by the trigger signal generation means, it is possible to carry out offset adjustment with desired timing.

The cycle generation circuit 41, the power-on detection circuit 42, and the noise detection circuit 43 supply, to a START terminal of the offset data collection control circuit 31, an offset adjustment instruction signal serving as the trigger signal indicative of timing with which offset adjustment is carried out. Further, the external signal 44 is input as an offset adjustment instruction signal to the START terminal of the offset data collection control circuit 31. Receiving the offset adjustment instruction signal input to the START terminal, the offset data collection control circuit 31 is instructed to carry out offset adjustment. Accordingly, in order to cause the offset adjustment circuit 22 to collect offset data and carry out offset adjustment, the offset data collection control circuit 31 generates signals NULL, /NULL, RSTALL, RST0, SET0, RST1, SET1, RST2, SET2, RST3, and SET3 and supplies the signals to the offset adjustment circuit 22, thereby triggering generation of an offset.

It is preferable that these trigger signal generating means are initialized after offset adjustment of the output voltage of the operational amplifier 1a has been completed. Consequently, it is possible to prevent offset adjustment from being repeated when the operational amplifier 1a is in a normal state after offset adjustment has been completed. As a result, it is possible to reduce the operation of the offset adjustment as little as possible.

The cycle generation circuit (cycle generator) 41 generates a cycle signal as the offset adjustment instruction signal and supplies the cycle signal. Thus, the cycle generation circuit 41 periodically instructs the offset data collection control circuit 31 to carry out offset adjustment. With the cycle generation circuit 41, the offset adjustment circuit 22 can periodically collect offset data. Therefore, even if collected offset data changes or the offset value of the operational amplifier 1a changes due to a change in environments, offset data is collected again and suitable offset data continues to be stored. Note that, when an adjustment operation of the operational amplifier 1a in collecting offset data disturbs a display, a cycle of an offset adjustment instruction signal is lengthened.

The power-on detection circuit (power-on detector) 42 detects rising of a power voltage of a display device, generates an offset adjustment instruction signal indicative of rising of a power voltage, and supplies the signal to the offset data collection control circuit 31. Generally, when a power source is turned off, collected offset data volatilizes from the latch circuit DDLk. Therefore, by the power-on detection circuit 42 collecting offset data when the power source is turned on, it is possible to carry out offset adjustment with appropriate timing. Further, because offset data is collected when the power source is turned on, offset adjustment is carried out at an initial period for setting display state. Consequently, display state is not affected.

The noise detection circuit (noise detection device) 43 detects a noise that may be a disturbance to offset data latched by the latch circuit DDLk, generates an offset adjustment instruction signal indicative of detection of the noise, and supplies the signal to the offset data collection control circuit 31. When offset data is disturbed, offset adjustment for the operational amplifier 1a is not carried out properly and offset is generated. Therefore, by collecting offset data at a time when the noise detection circuit 43 detects a noise, it is possible to always store suitable offset data. Thus, it is possible to always keep a suitable display state.

The external signal 44 is a signal input from the outside. Examples of the external signal 44 include a reset signal, a vertical synchronization signal, a horizontal synchronization signal, a blanking period signal, a data transfer signal etc. When offset data is collected in response to the external signal 44, it is possible to control timing of the collection of offset data as required. In particular, when the display device is reset, it is necessary to initialize all circuits, and therefore it is convenient to collect offset data at a reset time in response to the reset signal. Further, when the vertical synchronization signal or the blanking period signal is used, it is possible to collect offset data periodically (e.g. with respect to each frame or with respect to some frames). Consequently, it is possible to deal with changes in offset data and an offset due to changes in environments. In particular, when offset data is collected during a blanking period, it is possible to prevent offset adjustment from having bad influence on a display state.

The following specifically explains an example of a configuration of the power-on detection circuit 42 and the noise detection circuit 43.

Figure 7A:
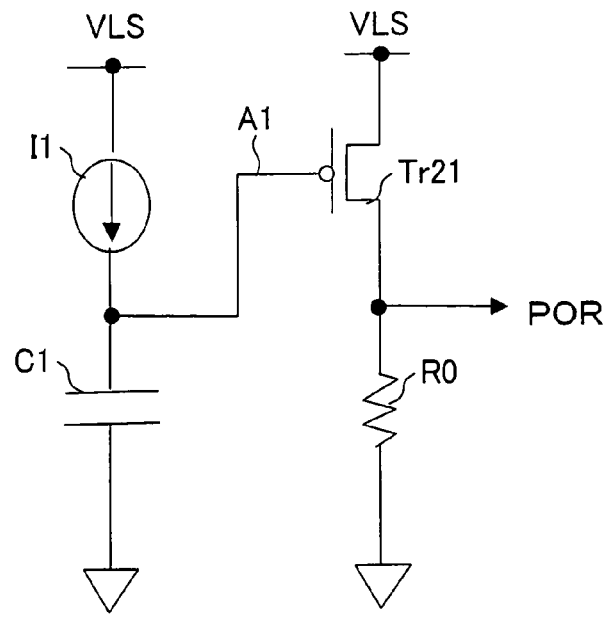
FIG. 7(a) is a circuit diagram illustrating a first configuration of a power-on detection circuit.
Figure 7B:
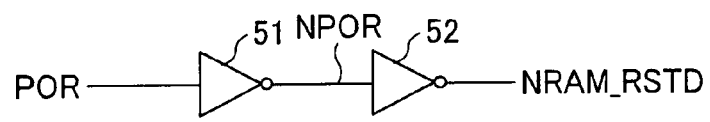
FIG. 7(b) is a circuit diagram illustrating the first configuration of the power-on detection circuit.
Figure 7C:
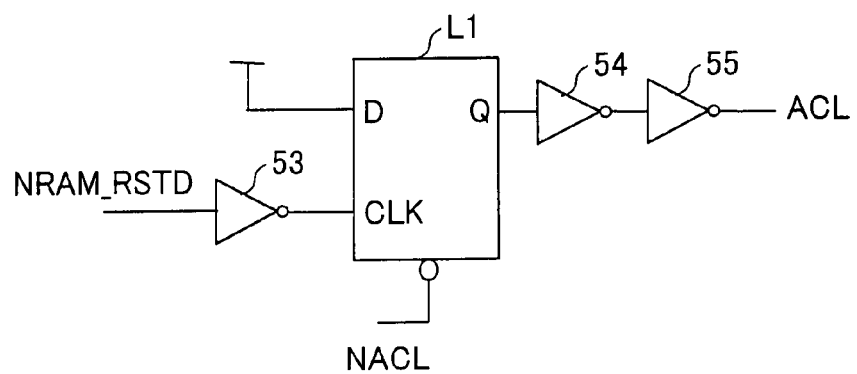
FIG. 7(c) is a circuit diagram illustrating the first configuration of the power-on detection circuit.

FIGS. 7(a) to 7(c) show a first configuration example of the power-on detection circuit 42.

FIG. 7(a) shows a part of the power-on detection circuit 42. This part is a circuit for generating a power-on reset signal POR. The circuit includes a constant current source 11, a capacitor C1, a MOS transistor Tr21, and a resistor R0. The MOS transistor Tr21 is a p-channel type. The constant current source I1 and the capacitor C1 are provided between a power source VLS and GND of the display device so that the constant current source I1 flows a current to the capacitor C1. The terminal of the capacitor C1 at the power source VLS side is connected with the gate of the MOS transistor Tr21. The source and the drain of the MOS transistor Tr21 are connected with the power source VLS and one end of the resistor R0, respectively. The other end of the resistor R0 is connected with GND. A node between the MOS transistor Tr21 and the resistor R0 is an output terminal of the power-on reset signal POR.

As shown in FIG. 7(b), the generated power-on reset signal POR is supplied to an inverter 51 so as to be a signal NPOR. The signal NPOR is supplied to an inverter 52 so as to be a signal NRAM_RSTD.

As shown in FIG. 7(c), the signal NRAM_RSTD is supplied to a clock terminal CLK of a D latch circuit L1 via an inverter 53. A D terminal of the D latch circuit L1 is connected with a power source for supplying a voltage corresponding to a High logic level. A signal from a Q terminal of the D latch circuit L1 becomes a signal ACL sequentially via inverters 54 and 55. Further, the D latch circuit L1 is reset in response to a reset signal NACL in a negative logic. The reset signal NACL is generated by the offset data collection control circuit 31. The signal ACL is supplied as an offset adjustment instruction signal to the START terminal of the offset data collection control circuit 31.

Figure 8A:
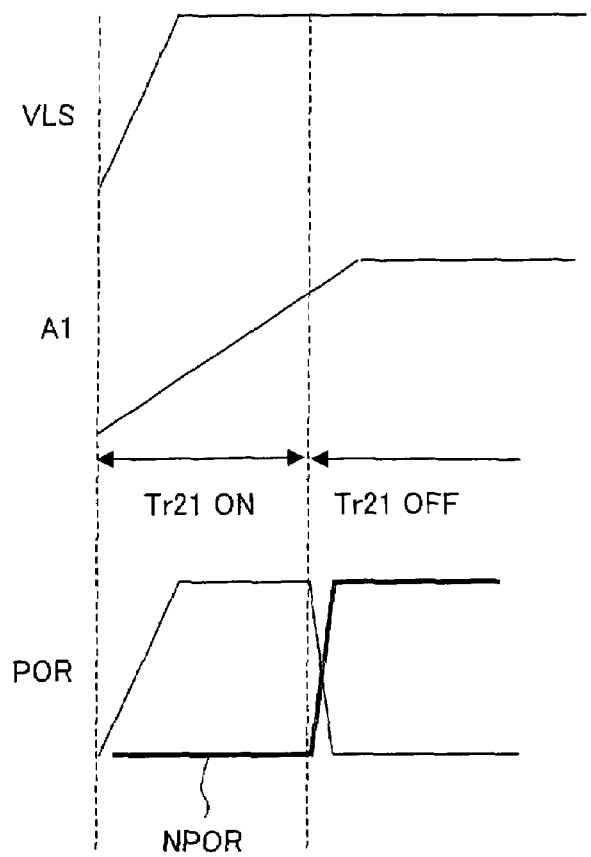
FIG. 8(a) is a signal diagram explaining an operation of the power-on detection circuit in FIG. 7.
Figure 8B:
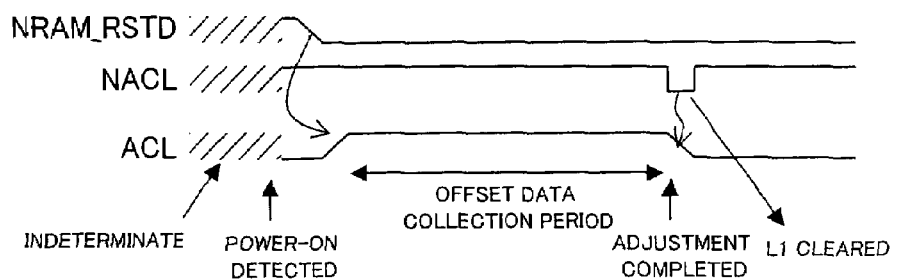
FIG. 8(b) is a signal diagram explaining an operation of the power-on detection circuit in FIG. 7.
Figure 9:
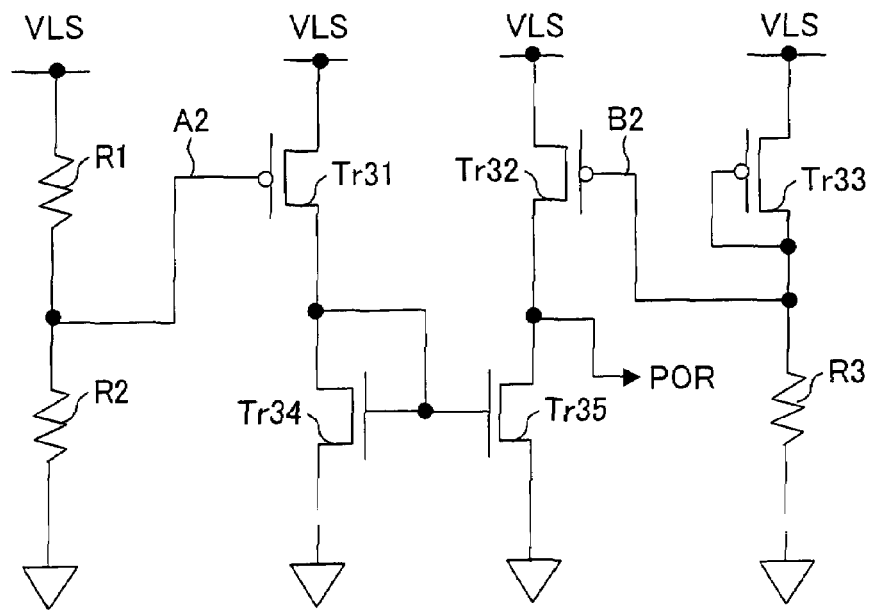
FIG. 9(a) is a circuit diagram illustrating a second configuration of a power-on detection circuit.
FIG. 9(b) is a circuit diagram illustrating the second configuration of the power-on detection circuit.
FIG. 9(c) is a circuit diagram illustrating the second configuration of the power-on detection circuit.
Figure 9:
Figure 9:
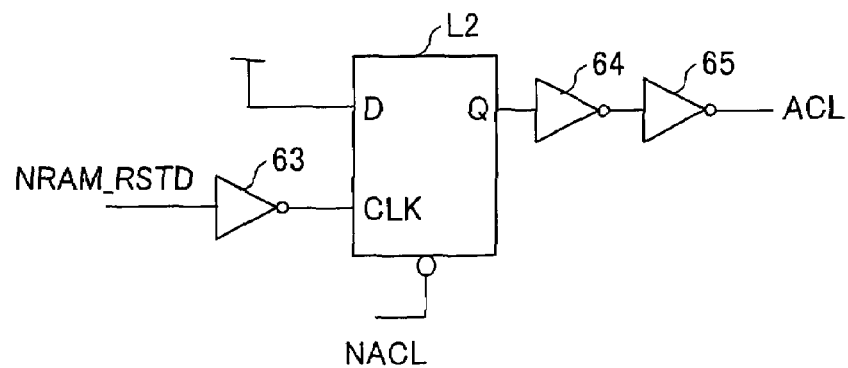

FIG. 8(a) shows changes in: a power source voltage of the power source VLS; a voltage at a point A1 which is both the terminal of the capacitor C1 at the power source VLS side and the gate of the MOS transistor Tr21; a voltage of the power-on reset signal POR; and the signal NPOR, each of the changes being caused after the power source is turned on. FIG. 8(b) shows timing charts of the signal NRAM_RSTD, the reset signal NACL, and the signal ACL.

In FIG. 8(a), in an initial state, the MOS transistor Tr 21 is in an on-state. As a voltage of the power source VLS increases gradually, the capacitor C1 is charged gradually by the constant current source I1, the point A1, that is, a voltage of the gate of the MOS transistor Tr21 increases (a voltage between the gate and the source drops), and a voltage of the power-on reset signal POR increases. The voltage of the power source VLS rises and the voltage of the power-on reset signal POR saturates at the High level, and then the MOS transistor Tr21 enters an off-state at a certain gate voltage, and the power-on reset signal POR changes to a GND potential (Low level). At that time, the signal NPOR which has been a GND potential (Low level) changes to the High level. Further, a voltage at the point A1 saturates at a value regulated by the voltage of the power source VLS.

In FIG. 8(b), signals have indeterminate logic before the power source is turned on. When the signal NPOR changes from the Low level to the High level due to the power-on, the signal NRAM_RSTD changes from the High level to the Low level. In accordance with this change in levels, High level is supplied to the clock terminal CLK. Further, the reset signal NACL rises as High level and reset is not carried out. Consequently, the Q terminal of the D latch circuit L1 supplies a signal input to the D terminal during a Low level period of the signal NRAM_RSTD, and the signal ACL becomes High level. A High level period of the signal ACL is an offset data collecting period. When the offset adjustment circuit 22 completes offset adjustment, the offset data collection control circuit 31 causes the reset signal NACL to be Low level. Consequently, the D latch circuit L1 is reset and the signal ACL becomes Low level.

FIGS. 9(a) to 9(c) show an example of a second structure of the power-on detection circuit 42.

FIG. 9(a) shows a part of the power-on detection circuit 42. This part is a circuit for generating a power-on reset signal POR. The circuit includes resistors R1, R2) and R3, and MOS transistors Tr31 to Tr35. The MOS transistors Tr31 to Tr33 are p-channel transistors. The MOS transistors Tr34 and Tr35 are n-channel transistors.

The resistors R1 and R2 are connected in series with each other between a power VLS and GND so that the resistor R1 is closer to the power source VLS. A node between the resistors R1 and R2 is connected with the gate of the MOS transistor Tr31. The source of the MOS transistor Tr31 is connected with the power source VLS and the drain of the MOS transistor Tr31 is connected with the drain of the MOS transistor Tr34.

The source of the MOS transistor Tr33 is connected with the power source VLS and the drain of the MOS transistor Tr33 is connected with one end of the resistor R3. The gate of the MOS transistor Tr33 is connected with the drain thereof. The other end of the resistor R3 is connected with GND. A node between the MOS transistor Tr33 and the resistor R3 is connected with the gate of the MOS transistor Tr32. The source and the drain of the MOS transistor Tr32 are connected with the power source VLS and the drain of the MOS transistor Tr35, respectively.

The gate of the MOS transistor Tr34 and the gate of the MOS transistor Tr35 are connected with each other. These gates are connected with the drain of the MOS transistor Tr34. The sources of the MOS transistors Tr34 and Tr35 are connected with GND. The MOS transistors Tr34 and Tr35 constitute a current mirror circuit.

The drain of the MOS transistor Tr32 serves as an output terminal of a power-on reset signal.

As shown in FIG. 9(b), the generated power-on reset signal POR is supplied to an inverter 61 so as to be a signal NPOR. The signal NPOR is supplied to an inverter 62 so as to be a signal NRAM_RSTD.

As shown in FIG. 9(c), the signal NRAM_RSTD is supplied to a clock terminal CLK of a D latch circuit L2 via an inverter 63. A D terminal of the D latch circuit L2 is connected with a power source for supplying a voltage corresponding to High level logic. A signal from a Q terminal of the D latch circuit L2 becomes a signal ACL sequentially via inverters 64 and 65. Further, the D latch circuit L2 is reset in response to a reset signal NACL in a negative logic. The reset signal NACL is generated by the offset data collection control circuit 31. The signal ACL is supplied as an offset adjustment instruction signal to the START terminal of the offset data collection control circuit 31.

Figure 10A:
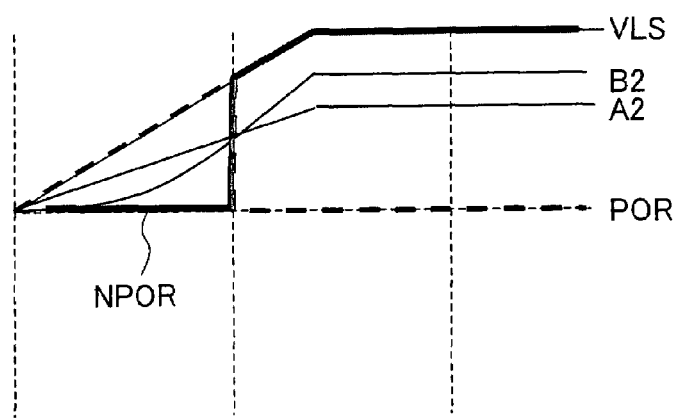
FIG. 10(a) is a signal diagram explaining an operation of the power-on detection circuit in FIG. 9.
Figure 10B:
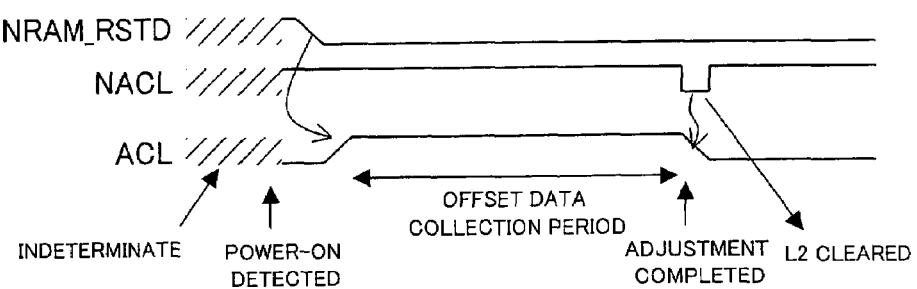
FIG. 10(b) is a signal diagram explaining an operation of the power-on detection circuit in FIG. 9.

FIG. 10(a) shows changes in: a voltage of the power source VLS; a voltage at a point A2 which is both (i) a node between the resistors R1 and R2 and (ii) the gate of the MOS transistor Tr31; a voltage at a point B2 which is both (i) a node between the MOS transistor Tr33 and the resistor R3 and (ii) the gate of the MOS transistor Tr32; a voltage of the power-on reset signal POR; and a voltage of the signal NPOR, each of the changes being caused after the power source is turned on. Further, FIG. 10(b) shows timing charts of the signal NRAM_RSTD, the reset signal NACL, and the signal ACL.

In FIG. 10(a), when the power source is turned on, a voltage of the power source VLS increases gradually. As a voltage of the point A2 is a voltage divided by the resistors R1 and R2, the voltage of the point A2 increases gradually. Further, when a drain voltage of the MOS transistor Tr33 is low, a gate voltage of the MOS transistor Tr33 is low. Accordingly, a voltage of the point B2 shifts an operating point so that a current increases. Although the voltage of the point B2 is lower than the voltage of the point A2 in an initial state, the voltage of the point B2 increases at a higher rate than the voltage of the point A2. Further, while the voltage of the point B2 is low, the MOS transistor T32 operates in a linear region. Accordingly, the voltage of the power-on reset signal POR increases at substantially the same rate as the voltage of the power source VLS.

On the other hand, in an initial state, the MOS transistor Tr31 operates in a saturation region because a difference between the voltage at the point A2 and the voltage of the power source VLS is small in the initial state. As the difference becomes gradually larger, the MOS transistor Tr31 shifts its operating point toward a linear region. Consequently, the voltage of the drain of the MOS transistor Tr34, that is, the voltage of the gate of the MOS transistor Tr34 becomes very high. Consequently, although the MOS transistor Tr34 operates in the saturation region, the MOS transistor Tr32 operates in the saturation region because the voltage at the point B2 becomes closer to the voltage of the power source VLS. Accordingly, the MOS transistor Tr35 operates in the linear region. Consequently, the drain voltage of the MOS transistor Tr35, that is, the voltage of the power-on reset signal POR becomes a value close to a GND potential (Low level).

At that time, the signal NPOR which has been the GND potential (Low level) changes to High level regulated by the voltage of the power source VLS. Further, the voltages at the points A2 and B2 saturate at a value regulated by the voltage of the power source VLS.

In FIG. 10(b), signals have indeterminate logic before the power source is turned on. When the signal NPOR changes from the Low level to the High level due to the power-on, the signal NRAM_RSTD changes from the High level to the Low level. In accordance with this change in levels, High level logic is supplied to the clock terminal CLK. Further, the reset signal NACL rises as High level and reset is not carried out. Consequently, the Q terminal of the D latch circuit L2 supplies a signal input to the D terminal during a Low level period of the signal NRAM_RSTD, and the signal ACL becomes High level. A High level period of the signal ACL is an offset data collecting period. When the offset adjustment circuit 22 completes offset adjustment, the offset data collection control circuit 31 causes the reset signal NACL to be Low level. Consequently, the D latch circuit L2 is reset and the signal ACL becomes Low level.

Figure 11:
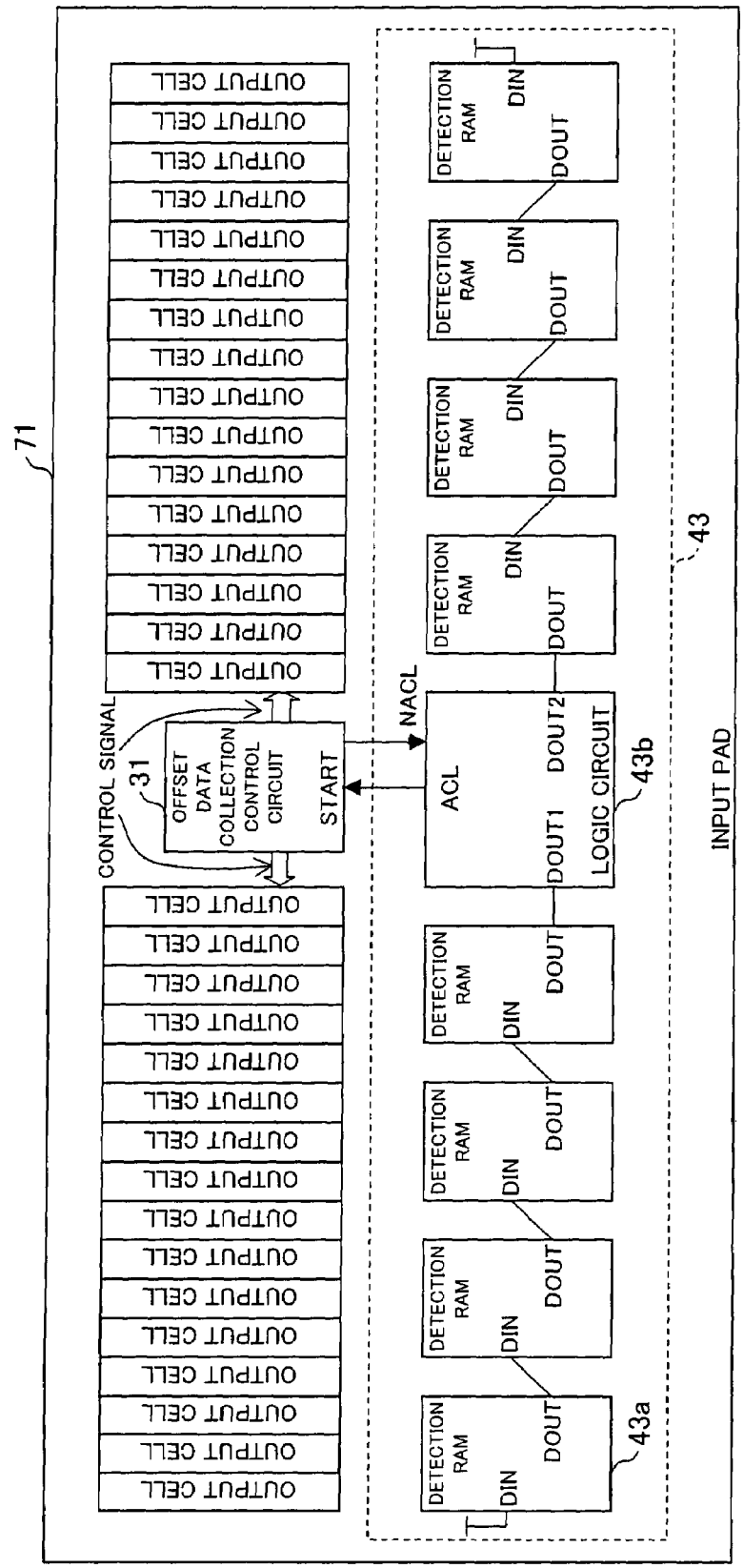
FIG. 11 is a block diagram illustrating a configuration of a noise detection circuit.

FIG. 11 shows an example of a structure of the noise detection circuit 43.

The noise detection circuit 43 is provided in a source driver 71. The source driver 71 includes multiple output cells. Each of the output cells corresponds to the operational amplifier circuit 21 shown in FIG. 3. In FIG. 11, the output cells are divided into two groups provided at a left side and a right side, respectively. The offset data collection control circuit 31 is provided between the output cells at the left side and the output cells at the right side.

The noise detection circuit 43 includes a plurality of detection RAMs (detection storage section) 43a and a logic circuit 43b. The detection RAMs 43a include: detection RAMs which are cascade-connected with each other by connecting their input DINs and output DOUTs and which are provided near the output cells at the left side; and detection RAMs which are cascade-connected with each other by connecting their input DINs and output DOUTs and which are provided near the output cells at the right side. The logic circuit 43b is provided between the detection RAMs 43a at the left side and the detection RAMs 43a provided at the right side. The number of the detection RAMs 43a is determined based on the number of the output cells. For example, one detection RAM 43a is provided with respect to every n output cells.

Out of the detection RAMs 43a at the left side, the detection RAM 43a at the left end has an input DIN which is a predetermined voltage. This input is transmitted rightward and supplied from the detection RAM 43a at the right end as an output DOUT. The output DOUT becomes an input DOUT1 of the logic circuit 43b. Out of the detection RAMs 43a at the right side, the detection RAM 43a at the right end has an input DIN which is a predetermined voltage. This input is transmitted leftward and supplied from the detection RAM 43a at the left end as an output DOUT. The output DOUT becomes an input DOUT2 of the logic circuit 43b.

In each group of the detection RAMs 43a at the left side and the detection RAMs 43a at the right side, when data (logical value) stored in at least one detection RAM 43a changes, this change is transmitted to the logic circuit 43b as a change in the output DOUT. When at least one of the inputs DOUT1 and DOUT2 changes, the logic circuit 43b considers that offset data stored in the output cell has changed due to generation of a noise and the logic circuit 43b judges that the noise is detected. The logic circuit 43b outputs a signal ACL as an offset adjustment instruction signal judgment signal) to the START terminal of the offset data collection control circuit 31, and causes the offset adjustment circuit 22 to collect offset data and to carry out offset adjustment. At that time, control signals supplied from the offset data collection control circuit 31 to the operational amplifier circuit 21 are signals shown in FIG. 6. When offset adjustment is completed, the offset data collection control circuit 31 supplies a reset signal NACL to the logic circuit 43b and resets the signal ACL from the logic circuit 43b.

A change in a logical value stored in the detection RAM 43a suitably reflects a noise which is a cause of a disturbance. Consequently, the noise detection circuit 43 can detect a noise satisfactory. Further, when a logical value in at least one of the detection RAM 43a changes, there is a possibility that a noise is generated. Therefore, providing the plurality of detection RAM 43a allows detecting a noise sensitively.

Figure 12A:
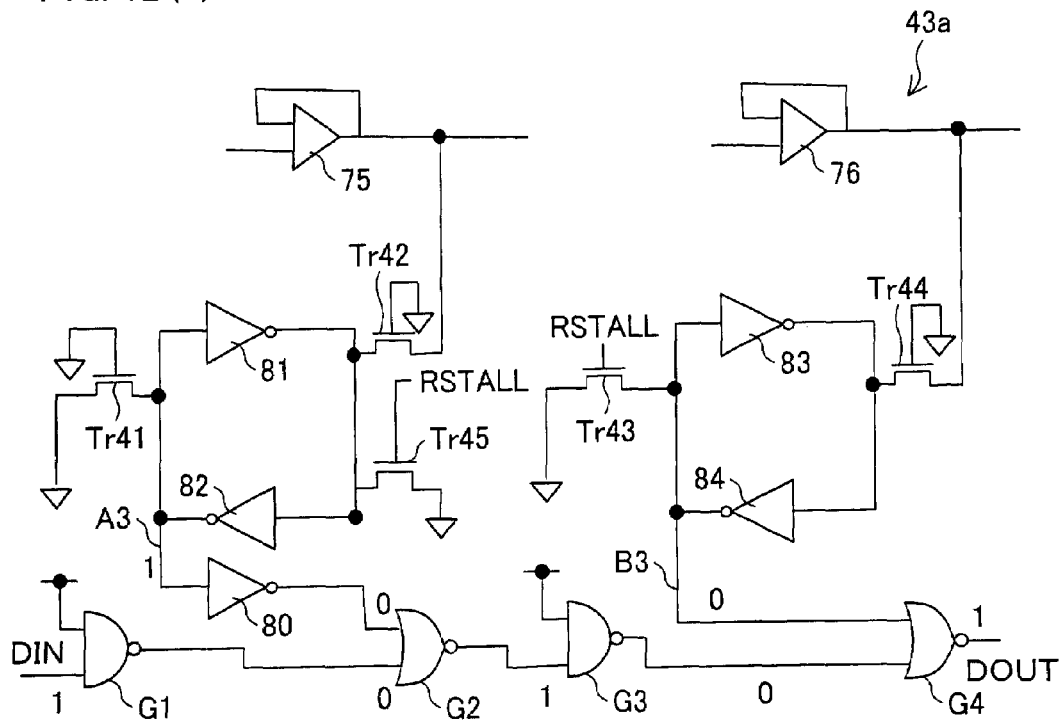
FIG. 12(a) is a circuit diagram illustrating a configuration of the noise detection circuit in FIG. 11.
Figure 12B:
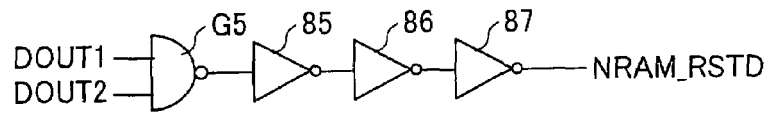
FIG. 12(b) is a circuit diagram illustrating a configuration of the noise detection circuit in FIG. 11.
Figure 12C:
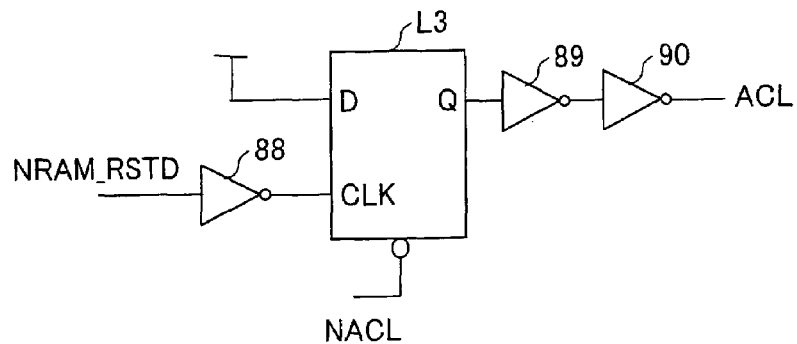
FIG. 12(c) is a circuit diagram illustrating a configuration of the noise detection circuit in FIG. 11.

FIG. 12(a) shows an example of a structure of the detection RAM 43a. FIGS. 12(b) and 12(c) show examples of structures of the logic circuit 43b.

In FIG. 12(a), the detection RAM 43a includes inverters 80 to 84, MOS transistors Tr41 to Tr45, NAND gates G1 and G3, and NOR gates G2 and G4. The MOS transistors Tr41 to Tr45 are n-channel transistors in FIG. 12(a). However, the MOS transistors Tr41 to Tr45 may be p-channel transistors. Each of the NAND gates G1 and G3 and the NOR gates G2 and G4 has two inputs.

Further, the detection RAM 43a is connected with amplifiers 75 and 76. Each of the amplifiers 75 and 76 corresponds to the operational amplifier 1a in FIG. 3. The amplifiers 75 and 76 are output amplifiers of adjacent output cells in FIG. 11.

An output of the inverter 81 is connected with an input of the inverter 82, and an input of the inverter 81 is connected with an output of the inverter 82, thereby constituting one latch circuit. The output of the inverter 81 and the input of the inverter 82 can be connected, via the MOS transistor Tr45, with a power source for supplying a voltage corresponding to GND, that is, Low level logic, and can be connected, via the MOS transistor Tr42, with the output of the amplifier 75. Further, the input of the inverter 81 and the output of the inverter 82 can be connected, via the MOS transistor Tr41, with a power source for supplying a voltage corresponding to High level logic. A reset signal input to the reset terminal RSTALL in FIG. 3 is input to the gate of the MOS transistor Tr45. A point A3, which is both the input of the inverter 81 and the output of the inverter 82, usually latches High level obtained by logically inverting Low level which is acquired via the MOS transistor Tr45. Alternatively, the input of the inverter 81 and the output of the inverter 82 acquire High level via the MOS transistor Tr41 and latches the High level. Alternatively, the output of the inverter 81 and the input of the inverter 82 acquire, via the MOS transistor Tr42, Low level from the amplifier 75 whose output voltage corresponds to Low level logic, and latch High level obtained by inverting the acquired Low level.

An output of the inverter 83 and an input of the inverter 84 are connected with each other and an input of the inverter 83 and an output of the inverter 84 are connected with each other, thereby constituting one latch circuit. The input of the inverter 83 and the output of the inverter 84 can be connected with GND via the MOS transistor Tr43. Further, the output of the inverter 83 and the input of the inverter 84 can be connected with the output of the amplifier 76 via the MOS transistor Tr44. A reset signal input to the reset terminal RSTALL in FIG. 3 is input to the gate of the MOS transistor Tr43. A point B3, which is both the input of the inverter 83 and the output of the inverter 84, usually latches Low level which is acquired from GND via the MOS transistor Tr43. Alternatively, the output of the inverter 83 and the input of the inverter 84 may acquire and latch, via the MOS transistor Tr44, High level from the amplifier 76 whose output voltage corresponds to High-level logic.

As described above, the detection RAM 43a includes a pair of latch circuits (storage elements) each having an exclusive logical value after initialization, and one of the latch circuits and the other of the latch circuits store different logical values. Accordingly, even if one of the two logical values change, it is possible to detect a noise.

The latch circuits are connected with the amplifiers 75 and 76 respectively via the MOS transistors Tr42 and Tr44 which are not turned on under normal conditions. This is because: by designing the detection RAM 43a to have configuration that is similar, as far as possible, to configuration of the latch circuit DDLk for collecting offset data, it is possible for the detection RAM 43a to simulate noise transmission from the operational amplifier 1a to the latch circuit DDLk. When the operational amplifier 1a is used as an output amplifier in a source driver of a display device, there is a possibility that a noise from an output pad connected with the operational amplifier 1a changes data in an offset storage RAM, that is, data in the latch circuit DDLk. For that reason, the detection RAM 43a is designed to be capable of directly detecting a noise from the output amplifier.

Further, each latch circuit latches in response to a reset signal input to the reset terminal RSTALL. Consequently, when the detection RAM 43a resets each latch circuit DDLk in starting offset adjustment in FIG. 3, the detection RAM 43a also can latch logic used for detection.

One input of the NAND gate G1 is the input DIN of the detection RAM 43a and the other input of the NAND gate G1 is in High level. The input DIN of the NAND gate G1 of the detection RAM 43a in a first stage of each group of the detection RAMs 43a at the left side and the detection RAMs 43a at the right side is in High level. The output of the NAND gate G1 is one of the inputs of the NOR gate G2. The other one of the inputs of the NOR gate G2 is a voltage obtained by logically inverting the voltage of the point A3 by the inverter 80. The output of the NOR gate G2 is one of the inputs of the NAND gate G3. The other one of the inputs of the NAND gate G3 is in High level. The output of the NAND gate G3 is one of the inputs of the NOR gate G4. The other one of the inputs of the NOR gate G4 is the voltage of the point B3.

With the above configuration, the inputs of the NOR gates G2 and G4 are usually "0, 0" and accordingly the output DOUT of each of the detection RAMs 43a is "1". When at least one logic of the points A3 and B3 is inverted due to a noise in any one of the detection RAM 43a, the output DOUT of all the detection RAMs 43a that are cascade-connected becomes "0".

In FIG. 12(*b*), the inputs DOUT1 and DOUT2 of the logic circuit 43b are input to the NAND gate G5 having two inputs. The output of the NAND gate G5 serially passes through the inverters 85, 86, and 87, and becomes a signal NRAM_RSTD.

As shown in FIG. 12(*c*), the signal NRAM_RSTD is input to the clock terminal CLK of the D latch circuit L3 via the inverter 88. The D terminal of the D latch circuit L3 is connected with a source for outputting a voltage corresponding to High level logic. An output signal from the Q terminal of the D latch circuit L3 serially passes through inverters 89 and 90 and becomes a signal ACL. Further, the D latch circuit L3 is reset in response to a reset signal NACL in negative logic. The reset signal NACL is generated by the offset data collection control circuit 31. The signal ACL is input as an offset adjustment instruction signal to the START terminal of the offset data collection control circuit 31.

Figure 13:
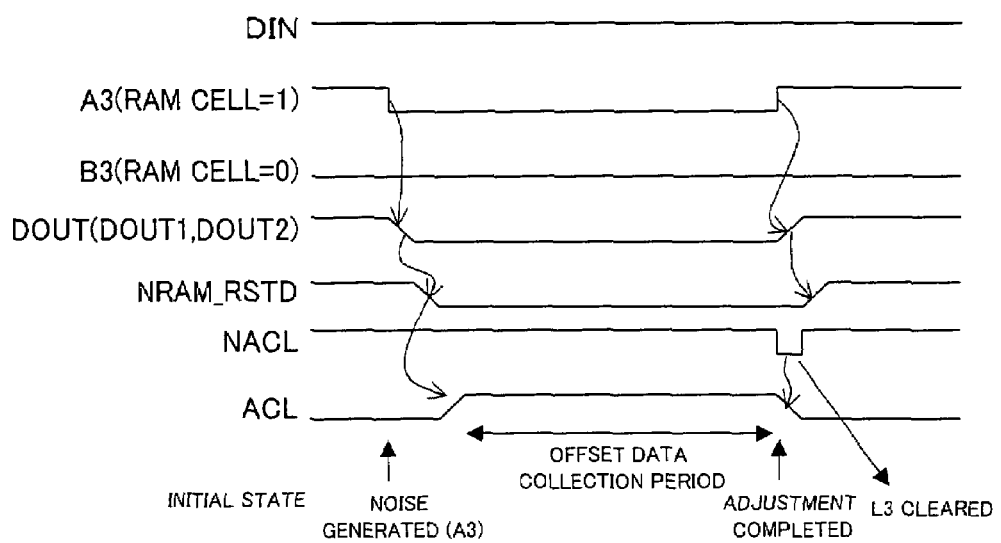
FIG. 13 is a signal diagram explaining an operation of the noise detection circuit in FIG. 12.

FIG. 13 is a timing chart showing logical changes in: input DIN of the detection RAM 43a in a first stage of each group of the detection RAMs 43a at the left side and the detection RAMs 43a at the right side; the point A3; the point B3; the output DOUT (inputs DOUT1 and DOUT2); the signal NRAM_RSTD; the reset signal NACL; and the signal ACL.

The input DIN of the detection RAM 43a in a first stage is set to High level. Assume that, when the point A3 latches High level and the point B3 latches Low level, logic of the point A3 changes to Low level due to a noise. At that time, the outputs DOUT of all the detection RAMs 43a that are cascade-connected become Low level, and accordingly input DOUT 1 or/and 2 from a latch circuit whose logic has changed due to the noise becomes Low level. Consequently, at least one of the inputs DOUT1 and DOUT2 becomes Low level and the NAND gate G5 of the logic circuit 43b outputs High level and the signal NRAM_RSTD becomes Low level. Meanwhile, the reset signal NACL maintains High level and accordingly the Q terminal of the D latch circuit L3 outputs a signal input to the D terminal during Low level period of the signal NRAM_RSTD and the signal ACL becomes High level. The High level period of the signal ACL is an offset data collection period. When the offset adjustment circuit 22 completes offset adjustment, the offset data collection control circuit 31 causes the reset signal NACL to be Low level. Consequently, the D latch circuit L3 is reset and the signal ACL becomes Low level.

Figure 14A:
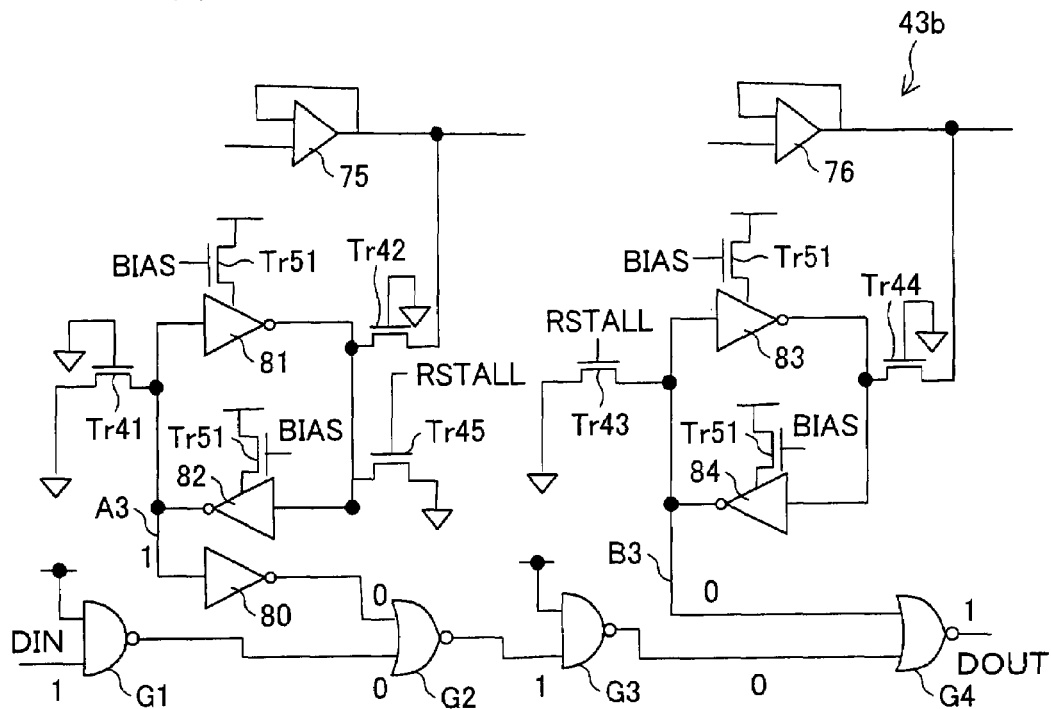
FIG. 14(a) is a circuit diagram illustrating a configuration of a modification example of a noise detection circuit.
Figure 14B:
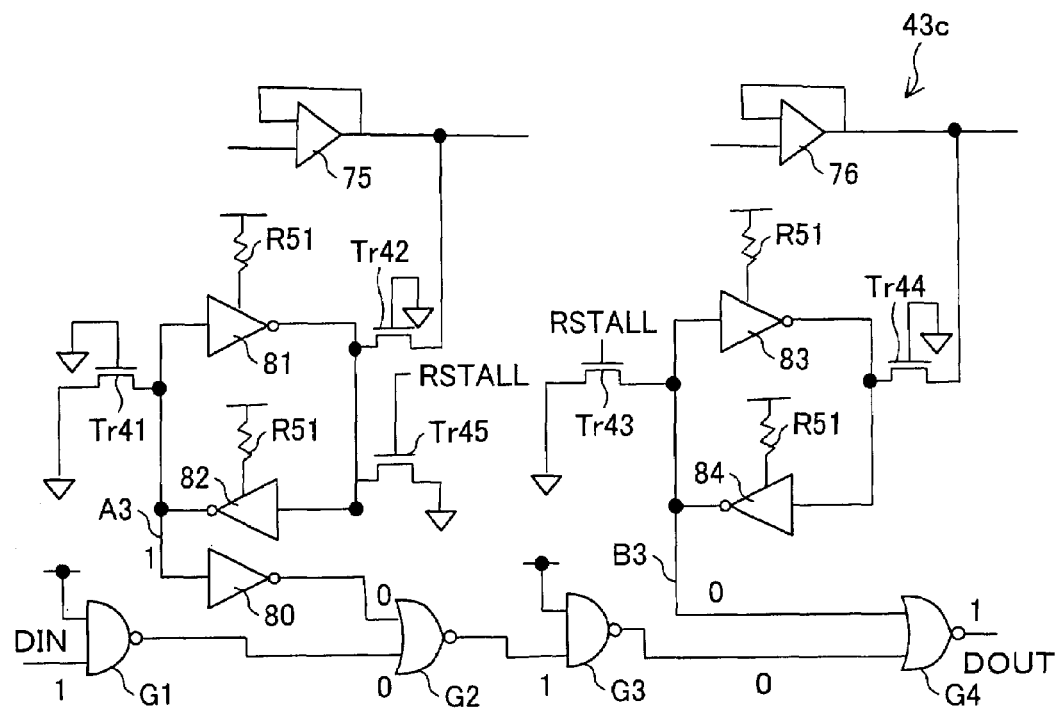
FIG. 14(b) is a circuit diagram illustrating a configuration of a modification example of a noise detection circuit.

It is desirable that the detection RAM 43a has high detection sensitivity for a noise so that the detection RAM 43a does not fail to detect a change in data in the latch circuit DLLk due to a noise. FIGS. 14(*a*) and 14(*b*) show examples of structures of detection RAMs having high detection sensitivity for a noise.

A detection RAM (detection storage section) 43b of FIG. 14(*a*) is a modification of the detection RAM 43a of FIG. 12(*a*) in which a MOS transistor Tr51 is provided between a power source and each of the inverters 81 to 84 constituting the latch circuit. In FIG. 14(*a*), the MOS transistor Tr51 is provided between a p-channel transistor and a power source at High side. Alternatively, the MOS transistor Tr51 may be provided between an n-channel transistor and a power source at Low side. A bias voltage BIAS having a predetermined voltage is applied on the gate of the MOS transistor Tr51. With the configuration, drive performance of the inverters 81 to 84 drops, the detection RAM 43*b* becomes sensitive to a noise than the storage section of the operational amplifier circuit 21, and latched data is more likely to change. The detection storage section is characterized in that it is more sensitive to the noise than the storage section.

A detection RAM (detection storage section) 43*c* of FIG. 14(*b*) is a modification of the detection RAM 43*a* of FIG. 12(*a*) in which a resistor 51 is provided between a power source and each of the inverters 81 to 84 constituting the latch circuit. In FIG. 14(*b*), the resistor 51 is provided between a p-channel transistor and a power source at High side. Alternatively, the resistor 51 may be provided between an n-channel transistor and a power source at Low side. With the configuration, drive performance of the inverters 81 to 84 drops, the detection RAM 43*c* becomes sensitive to a noise than the storage section of the operational amplifier circuit 21, and latched data is more likely to change.

Further, other than the configurations in FIGS. 14(*a*) and 14(*b*), by downsizing a transistor of an inverter constituting a latch circuit, it is possible to realize a detection RAM having high detection sensitivity to a noise.

As described above, by designing the detection RAM so that it is more sensitive to a noise than the storage section of the operational amplifier circuit 21, it is possible to detect a noise with more certainty without failing to detect a change in data in the storage section due to a noise.

The configuration for repeating offset adjustment with desired timing has been explained above. The configuration is applied to the operational amplifier circuit 21 in FIG. 3. Alternatively, the configuration is easily applicable to the operational amplifier circuit 1 in FIG. 1 and the operational amplifier circuit 11 in FIG. 2.

The following explains another configuration for properly maintaining offset data when there is a possibility that collected offset data changes due to a noise.

Figure 15:
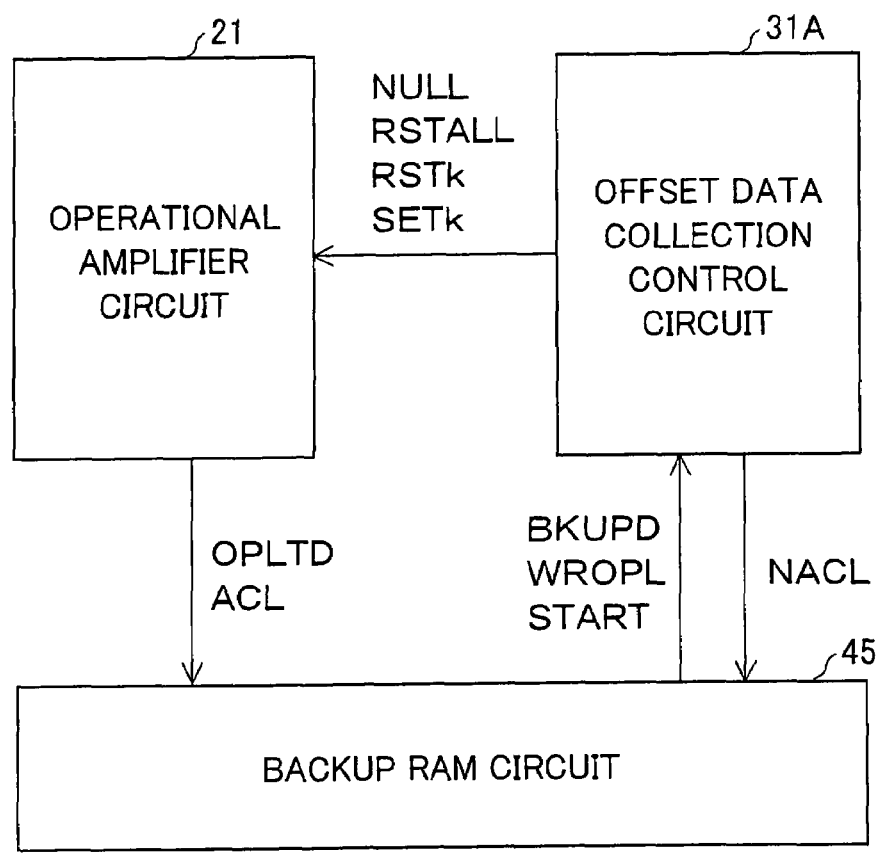
FIG. 15 is a block diagram illustrating another configuration for maintaining offset data normally.
Figure 16:
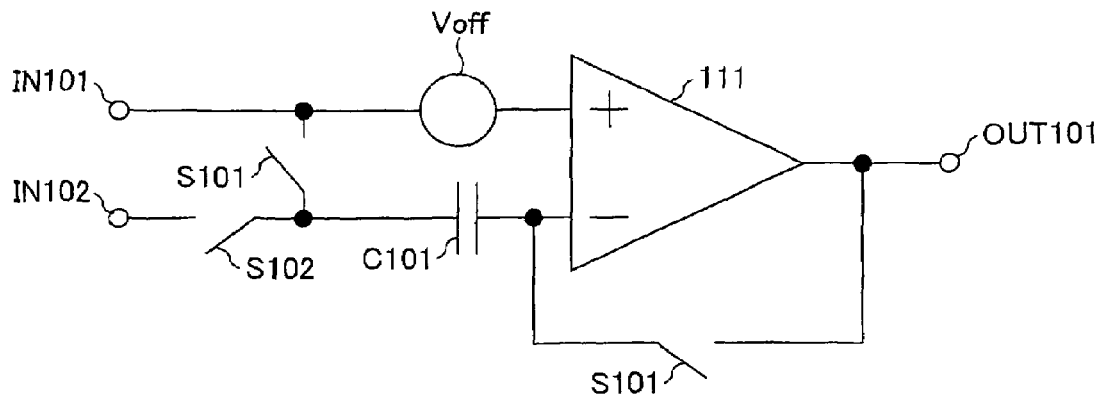
FIG. 16 is a circuit block diagram of a first conventional technique, illustrating a configuration of a main part of an operational amplifier including an offset adjustment circuit.
Figure 17:
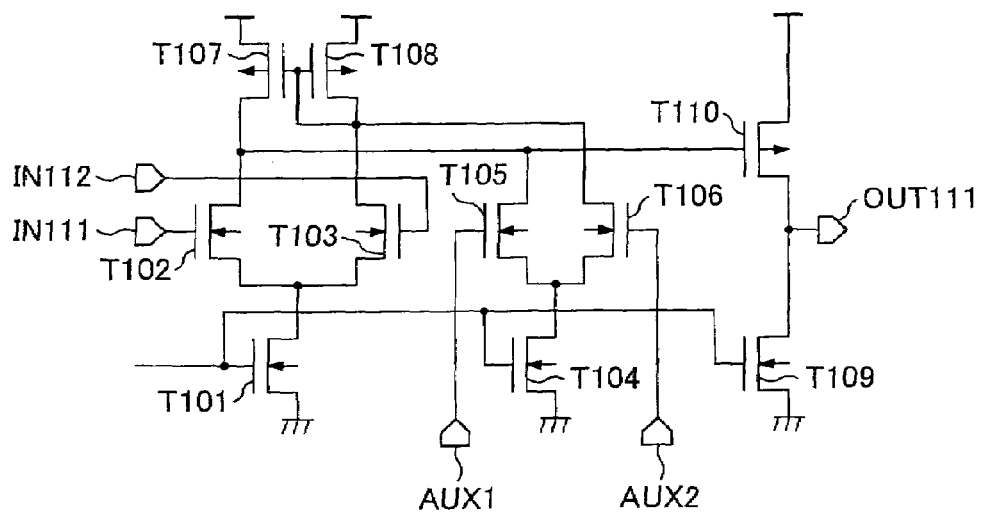
FIG. 17 is a circuit diagram of a second conventional technique, illustrating a configuration of an operational amplifier including an offset adjustment circuit.
Figure 18:
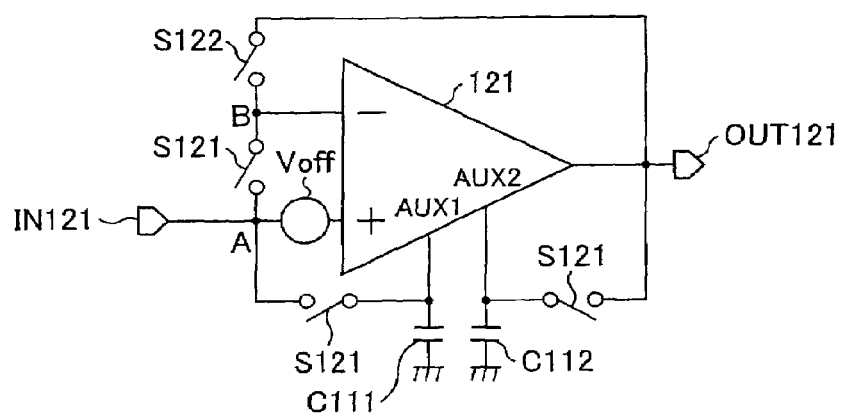
FIG. 18 is a circuit block diagram illustrating a configuration of a main part of an operational amplifier circuit including the operational amplifier in FIG. 17.
Figure 19:
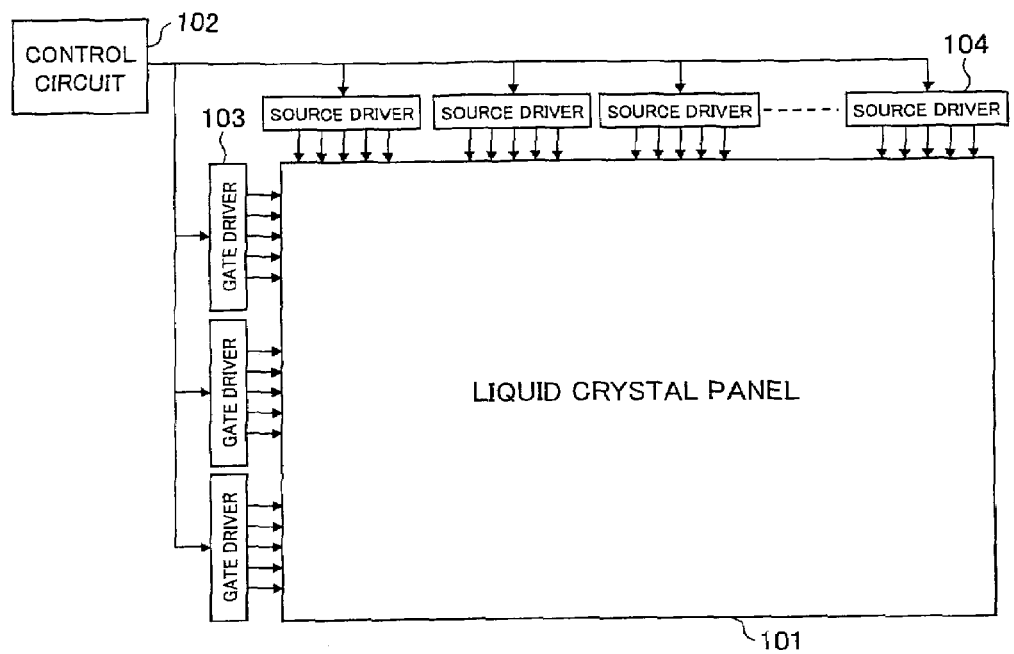
FIG. 19 is a block diagram illustrating a configuration of a TFT-LCD module.
Figure 20:
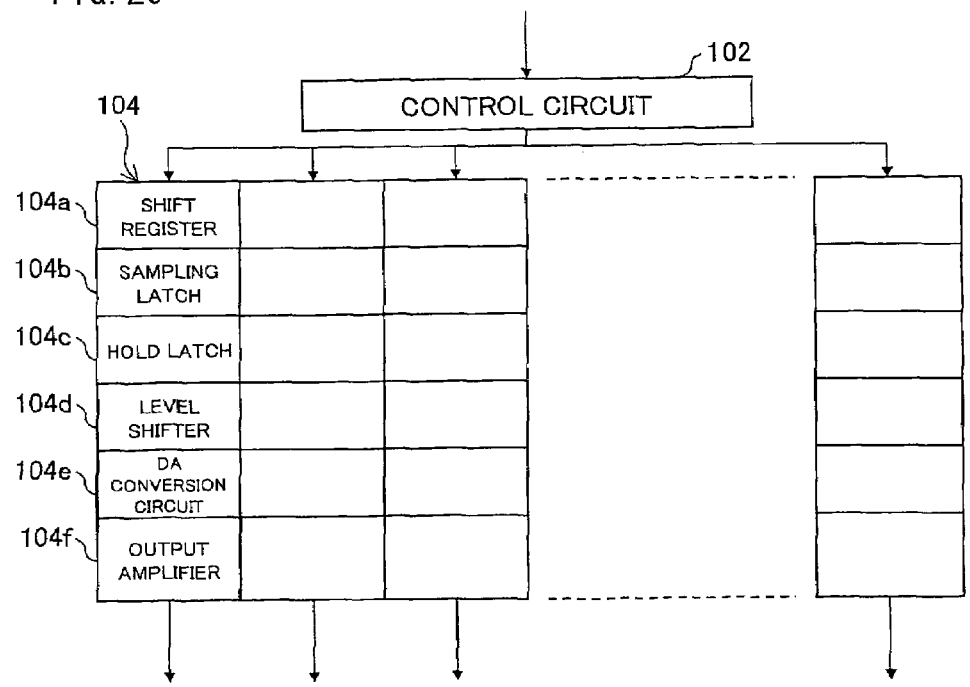
FIG. 20 is a block diagram illustrating a configuration of a source driver circuit included in the TFT-LCD module in FIG. 19.
Figure 21:
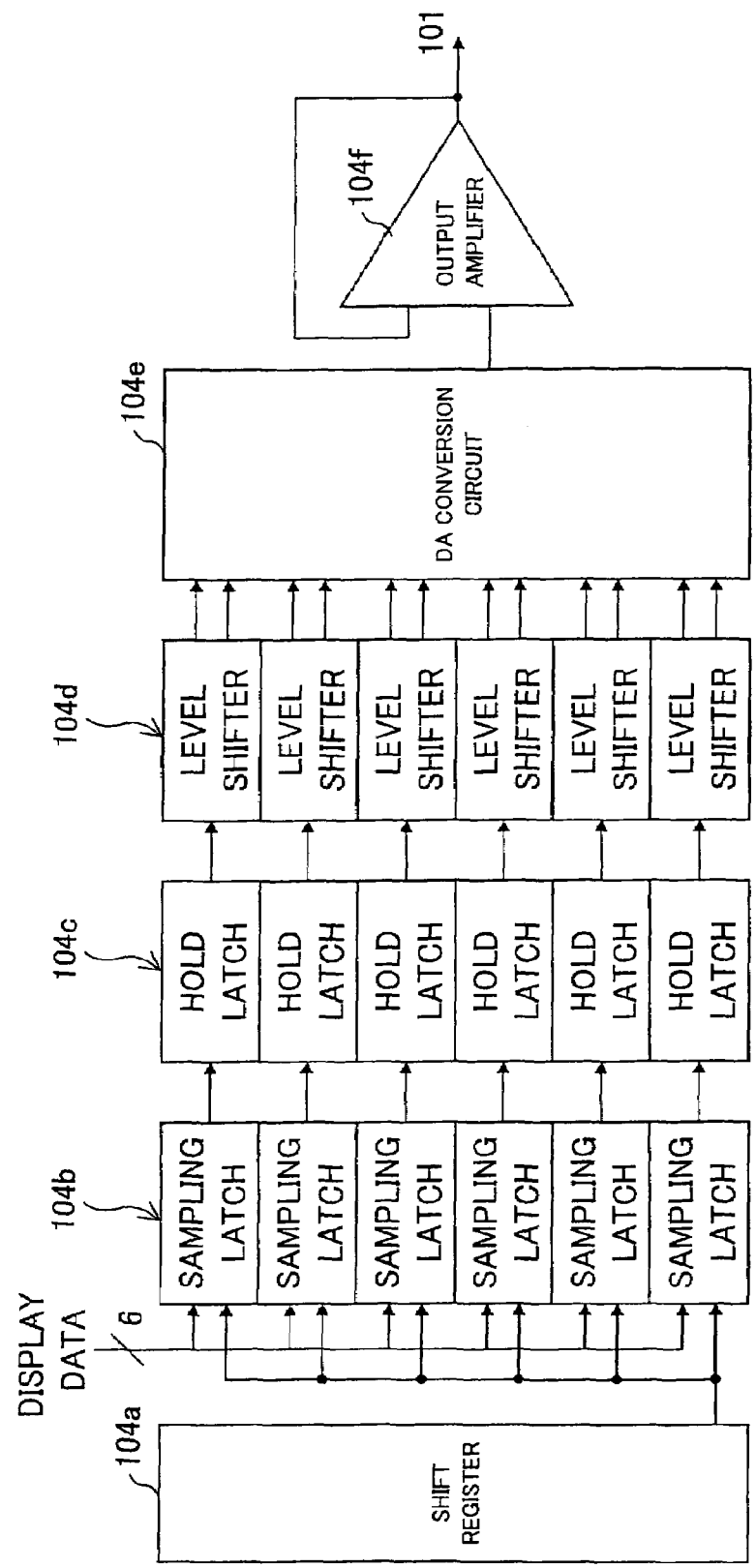
FIG. 21 is a block diagram illustrating a configuration of a block corresponding to each source signal line of the source driver circuit in FIG. 20.

As shown in FIG. 15, the configuration includes a backup RAM circuit (backup storage device) 45. Correspondingly, the configuration includes an offset data collection control circuit 31A instead of the offset data collection control circuit 31 in FIG. 6.

The backup RAM circuit 45 includes a plurality of backup storage elements. When a logical value stored in any one of the backup storage elements changes, the backup RAM circuit 45 determines that a noise is detected.

In FIG. 15, the offset data collection control circuit (offset generation control section) 31A controls the operational amplifier circuit 21 so that offset adjustment in the operational amplifier circuit 21 is completed, and thereafter a pulse reset signal NACL is supplied from the offset data collection control circuit 31A to the backup RAM circuit 45. In response to the reset signal NACL, the backup RAM circuit 45 acquires, from the operational amplifier circuit 21, offset data (n-bit logic data) OPLTD collected in offset adjustment, and stores the offset data OPLTD. Thereafter, the operational amplifier circuit 21 continues to supply a signal ACL indicative of "0" to the backup RAM circuit 45 unless offset adjustment is carried out again. Accordingly, the backup circuit 45 recognizes that the operational amplifier circuit 21 carries out a normal operation, that is, an operation after offset adjustment.

When offset data (hereinafter referred to as backup data) BKUPD stored in the backup RAM circuit 45 changes due to a noise, a noise detection circuit for detecting a noise of the backup data BKUPD detects the change. Then, the backup RAM circuit 45 acquires again the offset data OPLTD from the operational amplifier circuit 21 and overwrites and modifies the backup data BKUPD by using the offset data OPLTD.

When the offset data OPLTD stored in the operational amplifier circuit 21 changes due to a noise, a noise detection circuit for detecting a noise of the offset data OPLTD detects the change, and informs the backup RAM circuit 45 of the change. Then, the backup RAM circuit 45 causes a signal indicating that the offset data OPLTD changes, that is, a pulse writing enabling signal WROPL instructing offset adjustment, to be active, and supplies the signal WROPL to the offset data collection control circuit 31A, and the backup RAM circuit 45 transfers the backup data BKUPD to the offset data collection control circuit 31A. In response to the backup data BKUPD, the offset data collection control circuit 31A causes a reset signal input to the reset input terminal RSTALL of the operational amplifier circuit 21 to be active, and clears whole bits of the offset data OPLTD. Thereafter, with respect to bit "1" out of all bits of the backup data BKUPD, the offset data collection control circuit 31A causes a corresponding set input terminal SETk to be active, thereby correcting the offset data OPLTD.

When both of the offset data OPLTD and the backup data BKUPD change due to a noise, the backup RAM circuit 45 supplies a trigger signal to the START terminal of the offset data collection control circuit 31A, and the offset data collection control circuit 31A controls the operational amplifier circuit 21 so that offset adjustment is carried out again.

With the configuration of FIG. 15, even if a logical value stored in the storage section of the operational amplifier circuit 21 changes, the logical value is corrected based on backup data of the backup RAM circuit 45. Accordingly, the storage section can maintain a proper logical value. Further, even if the backup data changes due to a change in a logical value stored in any one of the backup storage elements, the backup data is corrected based on a logical value stored in the storage section. Accordingly, the backup data is always correct data. Further, even if both of the backup data and the logical value stored in the storage section change, correct offset data is lost. However, offset adjustment is carried out at that time, and accordingly it is possible to maintain correct offset data with offset adjustments as little as possible.

The main configurations of the present embodiments were explained above.

The operational amplifier circuit of the present embodiments is applicable to a semiconductor device such as a source driver. Further, the semiconductor device is applicable, as a display-driving device, to a display device. With this, it is possible to realize (i) a semiconductor device capable of carrying out offset adjustment by absorbing offset variations with a small-scale circuit without frequent refreshing, and (ii) a display device with high display quality, including a driving device capable of carrying out reliable offset adjustment with a small-scale circuit. In the semiconductor device or the display device, in order to carry out the offset adjustment with desired timing, generation of an offset is triggered at a time when the display device or a display panel is turned on or at a time when the semiconductor device operates, so that offset adjustment is carried out.

In the above embodiments, the operational amplifier 1*a* is an operational amplifier including an offset adjustment function terminal. Alternatively, the operational amplifier 1*a* may be an operational amplifier that carries out offset adjustment by adding an offset adjustment voltage to an input to an inverting input terminal. At that time, the offset adjustment signal s1 of the offset adjustment circuit 2, the offset adjustment signal s2 of the offset adjustment circuit 12, and the offset adjustment signal VCAL of the offset adjustment circuit 22 for example are used as signals for indicating, to means for adding a voltage to an inverting input terminal (not shown), a voltage to add. When the operational amplifier including the offset adjustment function terminal is used, an offset adjustment signal generated by a control circuit can be used as a signal to be input to an offset adjustment function terminal of a conventional operational amplifier including an offset adjustment function terminal.

Further, in the above embodiments, the latch circuit stores information for adjusting the offset in a static circuit, instead of storing the information in a dynamic circuit which stores the information by charging a capacitor. Accordingly, it is not necessary to (i) care for a parasitic effect such as feed-through in a switching element, and (ii) add a circuit for adjusting such a parasitic effect. As a result, a chip size and a cost can be reduced.

Further, in the above embodiments, the control circuit for generating an offset adjustment signal is a DA conversion circuit for generating an offset adjustment signal by carrying out a digital-analog conversion with respect to a second latch signal. With the configuration, the control circuit carries out a digital-analog conversion with respect to a logical signal with multiple bits. Accordingly, it is possible to adjust various kinds of an offset. Further, as each bit of a second latch signal is weighted by a control circuit, it is possible to quantize a logical signal with high resolution.

The offset adjustment device of the present embodiment may be arranged so that the offset is adjusted using the logical signal in such a manner that the logical value of the logical signal is temporarily determined, the offset is adjusted in accordance with the logical signal having the temporarily determined logical value, and thereafter determination of the logical value with respect to a subsequent output voltage and offset adjustment in accordance with the logical signal having the determined logical value are repeated.

With the offset adjustment device, the logical value of the logical signal is temporarily determined, and accordingly it is possible to compulsory generate an offset in accordance with the logical signal having the temporarily determined logical value. Thereafter, determination of the logical value with respect to a result of adjusting an offset thus generated and offset adjustment in accordance with the logical signal having the determined logical value are repeated. Consequently, it is possible to carry out offset adjustment while gradually reducing an offset toward zero.

The offset adjustment device of the present embodiment may be arranged so that the logical signal includes a multiple-bit logical value obtained by weighting and quantizing each bit.

With the arrangement, the binary logical signal includes a logical value obtained by weighting and quantizing each bit. Accordingly, by converting the stored logical signal into an analog signal, it is possible to carry out offset adjustment.

The offset adjustment device of the present embodiment may be arranged so that each of the latch circuits carries out a latch operation one by one.

With the offset adjustment device, each of the latch circuits latches an offset once. Accordingly, it is possible to carry out offset adjustment gradually and precisely.

The offset adjustment device of the present embodiment may be arranged so that, just before each of the latch circuit(s) latches the output voltage of the operational amplifier, the latch circuit receives a voltage for causing the latch circuit to output the first latch signal having the first logical value.

With the offset adjustment device, each of the latch circuits outputs the first latch signal by assuming that a positive offset exists. Accordingly, it is possible to cause all the latch circuits to operate surely and complete offset adjustment.

The offset adjustment device of the present embodiment may be arranged so that the operational amplifier includes an offset adjustment function terminal, and the control circuit supplies the offset adjustment signal to the offset adjustment function terminal.

With the arrangement, the control circuit can generate an offset adjustment signal to be input to an offset adjustment function terminal of a conventional operational amplifier.

The offset adjustment device of the present embodiment may be arranged so that each of the latch circuit(s) is configured by a static circuit.

With the embodiment, the latch circuit stores information for adjusting the offset in a static circuit, instead of storing the information in a dynamic circuit which stores the information by charging a capacitor. Accordingly, it is not necessary to (i) care for a parasitic effect such as feed-through in a switching element, and (ii) add a circuit for adjusting such a parasitic effect. As a result, a chip size and a cost can be reduced.

The offset adjustment device of the present embodiment may be arranged so that the control circuit is a DA conversion circuit for carrying out a digital-analog conversion with respect to the second latch signal so as to generate the offset adjustment signal.

With the arrangement, the control circuit carries out a digital-analog conversion with respect to a logical signal with multiple bits. Accordingly, it is possible to adjust various kinds of an offset.

The offset adjustment device of the present embodiment may be arranged so that each bit of the second latch signal is weighed by the control circuit.

With the arrangement, it is possible to quantize a logical signal with high resolution.

The offset adjustment device of the present embodiment may be arranged so that the operational amplifier includes a circuit element for use in phase compensation, and includes a switching element for disconnecting the circuit element from the operational amplifier.

With the offset adjustment device, disconnection of the operational amplifier from a phase compensating capacitor improves a high-frequency property of the operational amplifier, thus improving its through rate. This allows a quicker response of an output voltage with respect to the signal input to the offset adjustment input terminal. Thus, it is possible to process the offset adjustment in a shorter time.

The offset adjustment device of the present embodiment may be arranged so as to further include a trigger signal generating section for generating a trigger signal indicative of timing with which the offset of the output voltage of the operational amplifier is adjusted.

With the offset adjustment device, offset adjustment can be carried out with desired timing in response to a trigger signal generated by the trigger signal generating section.

The offset adjustment device of the present embodiment may be arranged so that the trigger signal generating section is a cycle generator for generating a cycle signal serving as the trigger signal, and the offset of the output voltage of the operational amplifier is adjusted in accordance with timing of a cycle of the cycle signal generated by the cycle generator.

The offset adjustment device carries out offset adjustment by periodically collecting offset data as a binary logical signal. Accordingly, even if collected offset data changes or an offset value of the operational amplifier changes due to a change in environments, it is possible to collect offset data again so as to continue to store suitable offset data.

The offset adjustment device of the present embodiment may be arranged so that the trigger signal generating section is a power-on detector for detecting that a power voltage of an apparatus including the offset adjustment device is applied, the power-on detector outputs, as the trigger signal, a power-on detection signal indicative of detecting that the power voltage is applied, and the offset of the output voltage of the operational amplifier is adjusted in accordance with timing of the power-on detection signal.

With the offset adjustment device, generally, when a power source is off, offset data collected as a binary logical signal volatilizes. Therefore, by the power-on detection circuit collecting offset data when the power source is turned on, it is possible to carry out offset adjustment with appropriate timing. Further, because offset data is collected when the power source is turned on, offset adjustment is carried out at an initial period for setting display state when a display device includes an offset adjustment device. Consequently, display state is not influenced.

The offset adjustment device of the present embodiment may be arranged so that the trigger signal generating section is a noise detection device for detecting a noise that is a disturbance to stored digital data, the noise detection device outputs, as the trigger signal, a noise detection signal indicative of detection of the noise, and the offset of the output voltage of the operational amplifier is adjusted in accordance with timing of the noise detection signal.

When offset data collected as a binary logical signal is disturbed by a noise, offset adjustment cannot be carried out properly and an offset is generated. With the offset adjustment device, the noise detection device collects offset data in detecting a noise, thereby always storing proper offset data.

The offset adjustment device of the present embodiment may be arranged so that the noise detection device includes a detection storage section for storing a logical value with which the noise is detected, and when the logical value stored in the detection storage section changes due to the noise, the noise detection device outputs a judgment signal indicative of judging that the noise is detected.

With the offset adjustment device, a change in the logical value stored in the detection storage section corresponds to intrusion of a noise that is a disturbance. Accordingly, it is possible to detect a noise properly.

The offset adjustment device of the present embodiment may be arranged so that the number of the detection storage section is plural.

With the arrangement, when a logical value in at least one of the detection storage sections changes, there is a possibility that a noise is generated. Consequently, it is possible to detect a noise sensitively.

The offset adjustment device of the present invention may be arranged so that the detection storage section includes a pair of storage elements respectively including logical values that are mutually exclusive after initialization.

With the offset adjustment device, each of the pair of storage elements respectively includes different logical values. Accordingly, when either one of the pair of storage elements changes, it is possible to detect a noise.

The offset adjustment device of the present embodiment may be arranged so that the detection storage section is more sensitive to the noise than the storage section.

With the offset adjustment device, the detection storage section is more sensitive to a noise than the storage section. Accordingly, it is possible to detect a noise with high certainty without failing to detect a change in data due to the noise in the storage section.

The offset adjustment device of the present embodiment may be arranged so that the trigger signal generating section is initialized after the offset of the output voltage of the operational amplifier is completely adjusted.

With the offset adjustment device, the trigger signal generating section is initialized after offset adjustment is completed. Accordingly, it is possible to reduce the operation of the offset adjustment as little as possible.

The offset adjustment device of the present embodiment may be arranged so as to further include a backup storage device for backing up the logical value stored in the storage section after the offset of the output voltage of the operational amplifier is completely adjusted, when the logical value stored in the storage section changes due to a noise that is a disturbance, the backup storage device outputting backup data and a writing enabling signal stored in the backup storage device, and the logical value stored in the storage section being corrected in accordance with the backup data and the writing enabling signal.

With the offset adjustment device, even if the logical value stored in the storage section changes, the logical value is corrected using backup data in the backup storage device. Accordingly, the storage section can maintain a correct logical value.

The offset adjustment device of the present embodiment may be arranged so that the backup storage device includes a plurality of backup storage elements, and when a logical value stored in any one of the backup storage elements changes due to the noise, the logical value stored in any one of the backup storage elements is corrected in accordance with the logical value stored in the storage section.

With the arrangement, even if backup data changes due to a change in the logical value stored in any one of the backup storage elements, the backup data is corrected by the logical value stored in the storage section. Accordingly, the backup data is always correct data.

The offset adjustment device of the present embodiment may be arranged so that when both of (i) the logical value stored in any one of the backup storage elements and (ii) the logical value stored in the storage section change due to the noise, the backup storage device generates a trigger signal indicative of timing with which the offset of the output voltage of the operational amplifier is adjusted.

When both of backup data and the logical value stored in the storage section change, correct offset data is cancelled. However, with the offset adjustment device, by carrying out offset adjustment at that time, it is possible to maintain correct offset data with as little offset data as possible.

The offset adjustment device of the present embodiment may be arranged so as to adjust the offset of the output voltage of the operational amplifier in response to an externally input signal.

With the offset adjustment device, offset data as a binary logical signal is collected in response to an externally input signal. Accordingly, it is possible to control timing with which offset data is collected.

The offset adjustment method of the present embodiment may be arranged so that the logical signal includes a multiple-bit logical value obtained by weighting and quantizing each bit.

With the offset adjustment method, the binary logical signal includes a logical value obtained by weighting and quantizing each bit. Accordingly, by converting the stored logical signal into an analog signal, it is possible to carry out offset adjustment.

The noise detection device of the present embodiment may be arranged so that the detection storage section includes a plurality of storage elements.

With the noise detection device, when a logical value in at least one of the storage elements changes, there is a possibility that a noise is generated. Consequently, it is possible to detect a noise sensitively.

The noise detection device of the present embodiment may be arranged so that the detection storage device includes a pair of storage elements respectively including logical values that are mutually exclusive after initialization.

With the noise detection device, each of the pair of storage elements respectively includes different logical values. Accordingly, when either one of the logical values changes, it is possible to detect a noise.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An offset adjustment device, comprising an operational amplifier that includes at least a non-inverting input terminal and an inverting input terminal, the offset adjustment device causing a storage section to store a binary logical signal indicative of an output voltage of the operational amplifier at a time when an output of the operational amplifier is not fed back to the non-inverting input terminal and the inverting input terminal and when the non-inverting input terminal and the inverting input terminal are short-circuited with each other, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value, the offset adjustment device adjusting an offset of the output voltage of the operational amplifier with respect to the reference value by using the logical signal stored in the storage section.

2. The offset adjustment device as set forth in claim 1, wherein the offset is adjusted using the logical signal in such a manner that the logical value of the logical signal is temporarily determined, the offset is adjusted in accordance with the logical signal having the temporarily determined logical value, and thereafter determination of the logical value with respect to a subsequent output voltage and offset adjustment in accordance with the logical signal having the determined logical value are repeated.

3. The offset adjustment device as set forth in claim 1, wherein the logical signal includes a multiple-bit logical value obtained by weighting and quantizing each bit.

4. An offset adjustment device, comprising an operational amplifier that includes at least a non-inverting input terminal and an inverting input terminal, the offset adjustment device further comprising:

a first switching element for short-circuiting the non-inverting input terminal and the inverting input terminal;

a second switching element for disconnecting one of the non-inverting input terminal and the inverting input terminal from a signal input terminal that, in a normal state of the operational amplifier, corresponds to the non-inverting input terminal and the inverting input terminal;

a latch section that includes one or more latch circuits each for latching a binary logical signal indicative of an output voltage of the operational amplifier and for outputting the logical signal as a first latch signal, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value;

a storage section for serially latching and storing the first latch signal that is input thereto multiple times in a chronological order from the latch section and for outputting a second latch signal with multiple bits in response to the first latch signal while serially latching the first latch signal; and a control circuit for (i) generating, in accordance with the second latch signal output from the storage section, an offset adjustment signal for adjusting an offset of the output voltage of the operational amplifier with respect to the reference value, and (ii) supplying the generated offset adjustment signal to the operational amplifier.

5. An offset adjustment device, comprising an operational amplifier that includes at least a non-inverting input terminal and an inverting input terminal, the offset adjustment device further comprising:

a first switching element for short-circuiting the non-inverting input terminal and the inverting input terminal;

a second switching element for disconnecting one of the non-inverting input terminal and the inverting input terminal from a signal input terminal that, in a normal state of the operational amplifier, corresponds to the non-inverting input terminal and the inverting input terminal;

a storage section that includes a plurality of latch circuits each for latching a binary logical signal indicative of an output voltage of the operational amplifier and for outputting the logical signal as a first latch signal, the logical signal having (i) a first logical value in a case where the output voltage is positive with respect to a reference value that is an ideal output voltage of the operational amplifier when a differential input is 0, and (ii) a second logical value in a case where the output voltage is negative with respect to the reference value, each of the latch circuits carrying out a latch operation with timing that is settable independently, the first latch signal being a predetermined logical value before the latch operation, and the storage section outputting a second latch signal with multiple bits in response to the first latch signal from each of the latch circuits; and a control circuit for (i) generating, in accordance with the second latch signal output from the storage section, an offset adjustment signal for adjusting an offset of the output voltage of the operational amplifier with respect to the reference value, and (ii) supplying the generated offset adjustment signal to the operational amplifier.

6. The offset adjustment device as set forth in claim 5, wherein each of the latch circuits carries out a latch operation one by one.

7. The offset adjustment device as set forth in claim 4, wherein, just before each of the latch circuit(s) latches the output voltage of the operational amplifier, the latch circuit receives a voltage for causing the latch circuit to output the first latch signal having the first logical value.

8. The offset adjustment device as set forth in claim 4, wherein each of the latch circuit(s) is configured by a static circuit.

9. The offset adjustment device as set forth in claim 4, wherein the control circuit is a DA conversion circuit for carrying out a digital-analog conversion with respect to the second latch signal so as to generate the offset adjustment signal.

10. The offset adjustment device as set forth in claim 4, wherein each bit of the second latch signal is weighed by the control circuit.

11. The offset adjustment device as set forth in claim 1, wherein the operational amplifier includes a circuit element for use in phase compensation, and includes a switching element for disconnecting the circuit element from the operational amplifier.

12. The offset adjustment device as set forth in claim 1, the offset adjustment device adjusting the offset of the output voltage of the operational amplifier in response to an externally input signal.

* * * * *